(12) United States Patent
Kim et al.

(10) Patent No.: US 12,219,830 B2
(45) Date of Patent: Feb. 4, 2025

(54) DISPLAY PANEL INCLUDING LOWER PATTERN ON FIRST BARRIER LAYER AND DISPLAY DEVICE INCLUDING THE SAME

(71) Applicant: Samsung Display Co., Ltd., Yongin-si (KR)

(72) Inventors: Na-Young Kim, Seongnam-si (KR); Dong-Hwi Kim, Osan-si (KR); Cheolsu Kim, Seoul (KR); Injun Bae, Seoul (KR); Woori Seo, Seoul (KR); Youngtaek Oh, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 699 days.

(21) Appl. No.: 17/361,072

(22) Filed: Jun. 28, 2021

(65) Prior Publication Data

US 2022/0109042 A1 Apr. 7, 2022

(30) Foreign Application Priority Data

Oct. 5, 2020 (KR) .................. 10-2020-0128350

(51) Int. Cl.
*H10K 59/35* (2023.01)
*G06V 40/13* (2022.01)
(Continued)

(52) U.S. Cl.
CPC ....... *H10K 59/131* (2023.02); *G06V 40/1318* (2022.01); *H10K 59/353* (2023.02); *H10K 59/65* (2023.02)

(58) Field of Classification Search
CPC .................................................. G06V 40/1318
See application file for complete search history.

(56) References Cited

U.S. PATENT DOCUMENTS 11,222,941 B2 1/2022 Park et al.
2010/0196655 A1 8/2010 Kai et al.
(Continued)

FOREIGN PATENT DOCUMENTS

JP 2009-237523 A 10/2009
KR 10-2010-0045300 A 5/2010
(Continued)

OTHER PUBLICATIONS

Notice of Allowance issued by the Korean Intellectual Property Office, on Nov. 22, 2024, for corresponding Korean Patent Application No. KR 10-2020-0128350, 7 pages.

*Primary Examiner* — Suberr L Chi
(74) *Attorney, Agent, or Firm* — Lewis Roca Rothgerber Christie LLP

(57) ABSTRACT

A display device includes a substrate, a first barrier layer on the substrate, a lower pattern on the first barrier layer and having a mesh shape defining a disconnection area, a second barrier layer on the first barrier layer, covering the lower pattern, and contacting the first barrier layer in the disconnection area, and a first active pattern on the second barrier layer and overlapping the lower pattern, a gate electrode on the first active pattern and overlapping the lower pattern, a first gate line on the first active pattern extending in a first direction, a second active pattern on the first gate line, a second gate line on the second active pattern extending in the first direction, and a data line on the second gate line extending in a second direction crossing the first direction.

18 Claims, 34 Drawing Sheets

(51) Int. Cl.
  *H10K 59/131*  (2023.01)
  *H10K 59/65*   (2023.01)

(56) References Cited

U.S. PATENT DOCUMENTS

2020/0144345 A1\* 5/2020 Cha ................... H10K 59/1213
2020/0394961 A1  12/2020 Kim et al.

FOREIGN PATENT DOCUMENTS

| KR | 10-1362136 B1    | 2/2014 |
| KR | 10-2018-0065731 A | 6/2018 |
| KR | 10-2019-0069952 A | 6/2019 |
| KR | 10-2020-0098779 A | 8/2020 |

\* cited by examiner

DISPLAY PANEL INCLUDING LOWER PATTERN ON FIRST BARRIER LAYER AND DISPLAY DEVICE INCLUDING THE SAME

CROSS-REFERENCE TO RELATED APPLICATION

This application claims priority to and the benefit of Korean Patent Application No. 10-2020-0128350, filed on Oct. 5, 2020, in the Korean Intellectual Property Office, the entire content of which is hereby incorporated by reference.

BACKGROUND

1. Field

Embodiments/implementations of the present disclosure relate generally to a display device.

2. Discussion of the Background

The display device includes a display panel, and transistors including an active pattern are formed in the display panel. An electric field may be generated inside the display panel due to signals and voltages provided to the display panel. Organic materials included in the organic film layer of the display panel may be polarized by the electric field. The polarized organic materials may have an electrical effect on the active pattern of the display panel. Accordingly, electrical characteristics of the transistors may be changed. In addition, the polarization phenomenon may be further accelerated by light incident on the display panel. For this reason, the display quality of the display device may be deteriorated.

The above information disclosed in this Background section is only for understanding of the background of the present disclosure, and, therefore, it may contain information that does not constitute prior art.

SUMMARY

Aspects of embodiments are directed toward a display panel with improved display quality.

Aspects of embodiments are directed toward a display device including the display panel.

Additional features of the present disclosure will be set forth in the description which follows, and in part will be apparent from the description, or may be learned by practice of the inventive concepts.

A display panel according to an embodiment may include a substrate, a first barrier layer disposed on the substrate, a lower pattern disposed on the first barrier layer and having a mesh shape including a disconnection area, a second barrier layer disposed on the first barrier layer, covering the lower pattern, and contacting the first barrier layer in the disconnection area, a first active pattern disposed on the second barrier layer and overlapping the lower pattern, at least one gate electrode disposed on the first active pattern and overlapping the lower pattern, at least one first gate line disposed on the first active pattern, extending in a first direction, and adjacent to a first side of the gate electrode on a plane, a second active pattern disposed on the first gate line, at least one second gate line disposed on the second active pattern, extending in the first direction, and adjacent to a second side of the gate electrode on a plane, wherein the second side is opposite to the first side, and at least one data line disposed on the second gate line and extending in a second direction crossing the first direction.

According to an embodiment, the lower pattern may include a first pattern extending in the second direction and a second pattern extending in the second direction and spaced apart from the first pattern in the first direction. The disconnection area may be located between the first pattern and the second pattern, and the first pattern and the second pattern may be not connected to each other.

According to an embodiment, a shape of the first pattern and a shape of second pattern may be the same.

According to an embodiment, the gate electrode may include first to fourth gate electrodes arranged in the first direction. The first pattern may include a first auxiliary pattern overlapping the first gate electrode, a second auxiliary pattern overlapping the second gate electrode, a third auxiliary pattern overlapping the third gate electrode, and a fourth auxiliary pattern overlapping the fourth gate electrode.

According to an embodiment, a second shape of the second auxiliary pattern may be symmetrical with a first shape of the first auxiliary pattern in the first direction. A fourth shape of the fourth auxiliary pattern may be symmetrical with a third shape of the third auxiliary pattern in the first direction.

According to an embodiment, the first to fourth auxiliary patterns may be connected to each other.

According to an embodiment, the display panel may further include at least one power voltage line disposed in a same layer as the data line, extending in the second direction, and transmitting a power voltage. The first auxiliary pattern may further overlap the power voltage line.

According to an embodiment, a second shape of the second pattern may be symmetrical with a first shape of the first pattern in the first direction.

According to an example embodiment, the gate electrode may include a first gate electrode and a second gate electrode which are arranged in the first direction, the first pattern overlaps the first gate electrode, and the second pattern overlaps the second gate electrode.

According to an embodiment, the display panel may further include at least one power voltage line disposed in a same layer as the data line, extending in the second direction, and transmitting a power voltage. The first pattern may further overlap the power voltage line.

According to an embodiment, the lower pattern may include a first pattern extending in the first direction and a second pattern extending in the first direction and spaced apart from the first pattern in the second direction. The disconnection area may be located between the first pattern and the second pattern, and the first pattern and the second pattern may be not connected to each other.

According to an embodiment, a shape of the first pattern and a shape of second pattern may be the same.

According to an embodiment, the gate electrode may include first and second gate electrodes arranged in the second direction, the first pattern may overlap the first gate electrode, and the second pattern may overlap the second gate electrode.

According to an embodiment, a thickness of the second barrier layer may be greater than a thickness of the first barrier layer.

According to an embodiment, the lower pattern may include the same metal as the gate electrode.

According to an embodiment, the first active pattern may include a silicon semiconductor, and the second active pattern may include an oxide semiconductor.

A display panel according to another embodiment may include a substrate, a first barrier layer disposed on the substrate, a lower pattern disposed on the first barrier layer and having an island shape, a second barrier layer disposed on the first barrier layer and covering the lower pattern, a first active pattern disposed on the second barrier layer and overlapping the lower pattern, at least one gate electrode disposed on the first active pattern and overlapping the lower pattern, at least one first gate line disposed on the first active pattern, extending in a first direction, and adjacent to a first side of the gate electrode on a plane, a second active pattern disposed on the first gate line, at least one second gate line disposed on the second active pattern, extending in the first direction, and adjacent to a second side of the gate electrode on a plane, wherein the second side is opposite to the first side, and at least one data line disposed on the second gate line and extending in a second direction crossing the first direction.

According to an embodiment, the gate electrode may include a plurality of gate electrodes arranged in a matrix shape. The lower pattern may include a first pattern and a second pattern which is not connected to the first pattern and has a same shape as a shape of the first pattern. The first pattern may have a mesh shape and may overlap the plurality of gate electrodes.

A display device according to an embodiment may include a display panel. The display panel may include a substrate, a first barrier layer disposed on the substrate, a lower pattern disposed on the first barrier layer and having a mesh shape including a disconnection area, a second barrier layer disposed on the first barrier layer, covering the lower pattern, and contacting the first barrier layer in the disconnection area, a first active pattern disposed on the second barrier layer and overlapping the lower pattern, at least one gate electrode disposed on the first active pattern and overlapping the lower pattern, at least one first gate line disposed on the first active pattern, extending in a first direction, and adjacent to a first side of the gate electrode on a plane, a second active pattern disposed on the first gate line, at least one second gate line disposed on the second active pattern, extending in the first direction, and adjacent to a second side of the gate electrode on a plane, wherein the second side is opposite to the first side, and at least one data line disposed on the second gate line and extending in a second direction crossing the first direction.

According to an embodiment, the display device may further include an optical sensor module disposed under the display panel and overlapping a fingerprint recognition area, and an air layer disposed between the display panel and the optical sensor module and overlapping the fingerprint recognition area. The lower pattern may overlap the fingerprint recognition area.

Therefore, a display device according to embodiments may include a lower pattern disposed between an organic film layer and an active pattern and having a mesh shape. The lower pattern may shield the active pattern from polarized organic materials included in the organic film layer. Accordingly, electrical influences (e.g., formation of a back channel) due to the organic materials may not be applied to the active pattern, and electrical characteristics of transistors including the active pattern may not be changed. Accordingly, display quality of the display device may be improved.

In addition, the lower pattern may have a mesh shape including a disconnection area. For example, the lower pattern may not be formed in the disconnection area. Accordingly, the lower pattern may include a plurality of patterns that are not connected to each other. As the lower pattern is removed from the disconnection area, a unit area of the lower pattern may be reduced. Accordingly, resistance of the lower pattern may be increased, and crosstalk between the lower pattern and the data line may be improved. Accordingly, crosstalk between the lower pattern and the gate electrode may be improved, and display quality of the display device may be further improved.

It is to be understood that both the foregoing general description and the following detailed description provide examples, are explanatory, and are intended to provide further explanation of the invention as claimed.

BRIEF DESCRIPTION OF THE DRAWINGS

The accompanying drawings, which are included to provide a further understanding of the present disclosure and are incorporated in and constitute a part of this specification, illustrate embodiments of the present disclosure, and together with the description serve to explain the inventive concepts.

DETAILED DESCRIPTION

Figure 1:
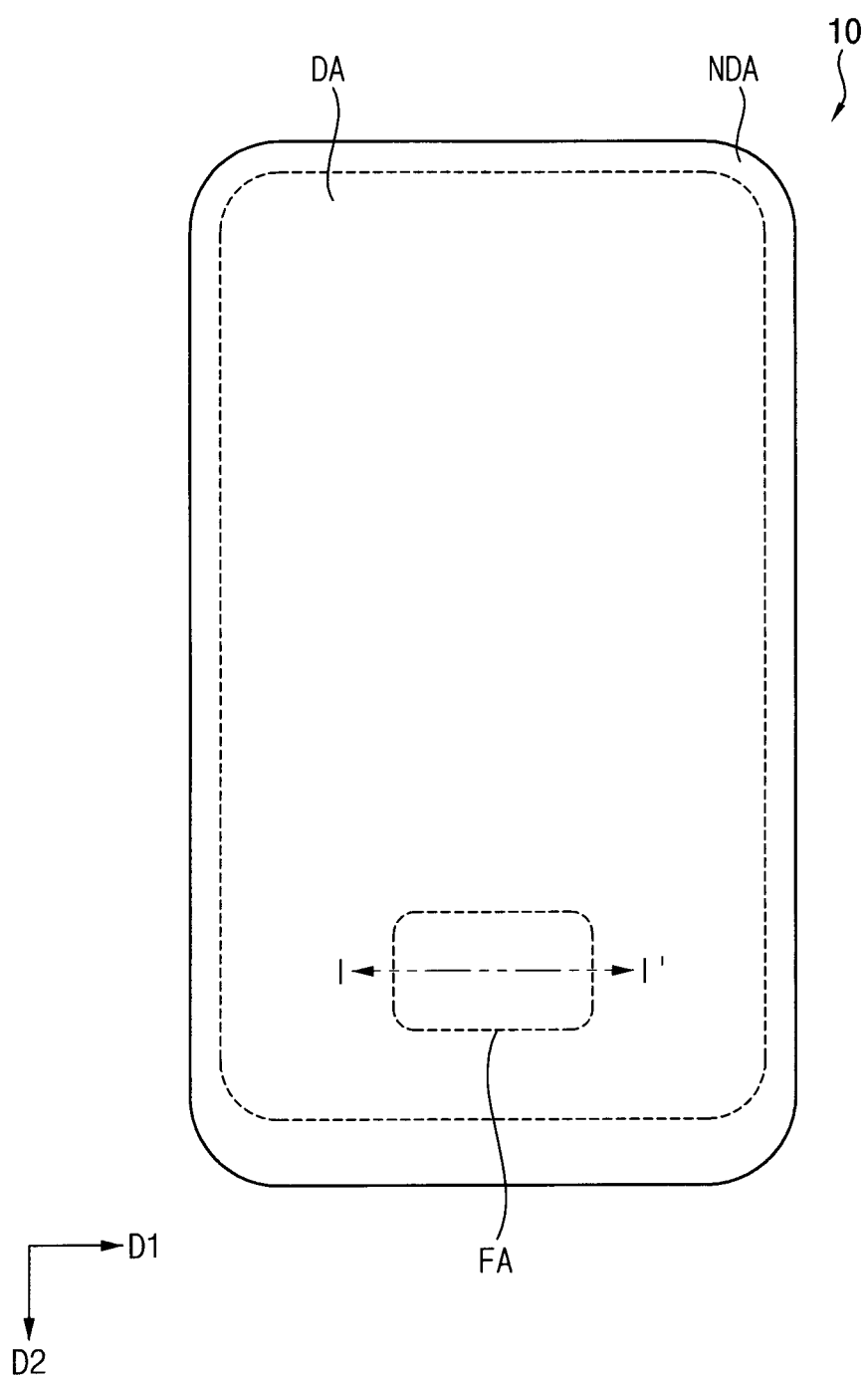
FIG. 1 is a plan view illustrating a display device according to an embodiment.

In the following description, for the purposes of explanation, numerous specific details are set forth in order to provide a thorough understanding of various embodiments or implementations of the present disclosure. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are illustrated in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening element(s) or layer(s) may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the illustrative embodiments of the present disclosure.

Illustrative, non-limiting embodiments will be more clearly understood from the following detailed description in conjunction with the accompanying drawings.

Figure 2:
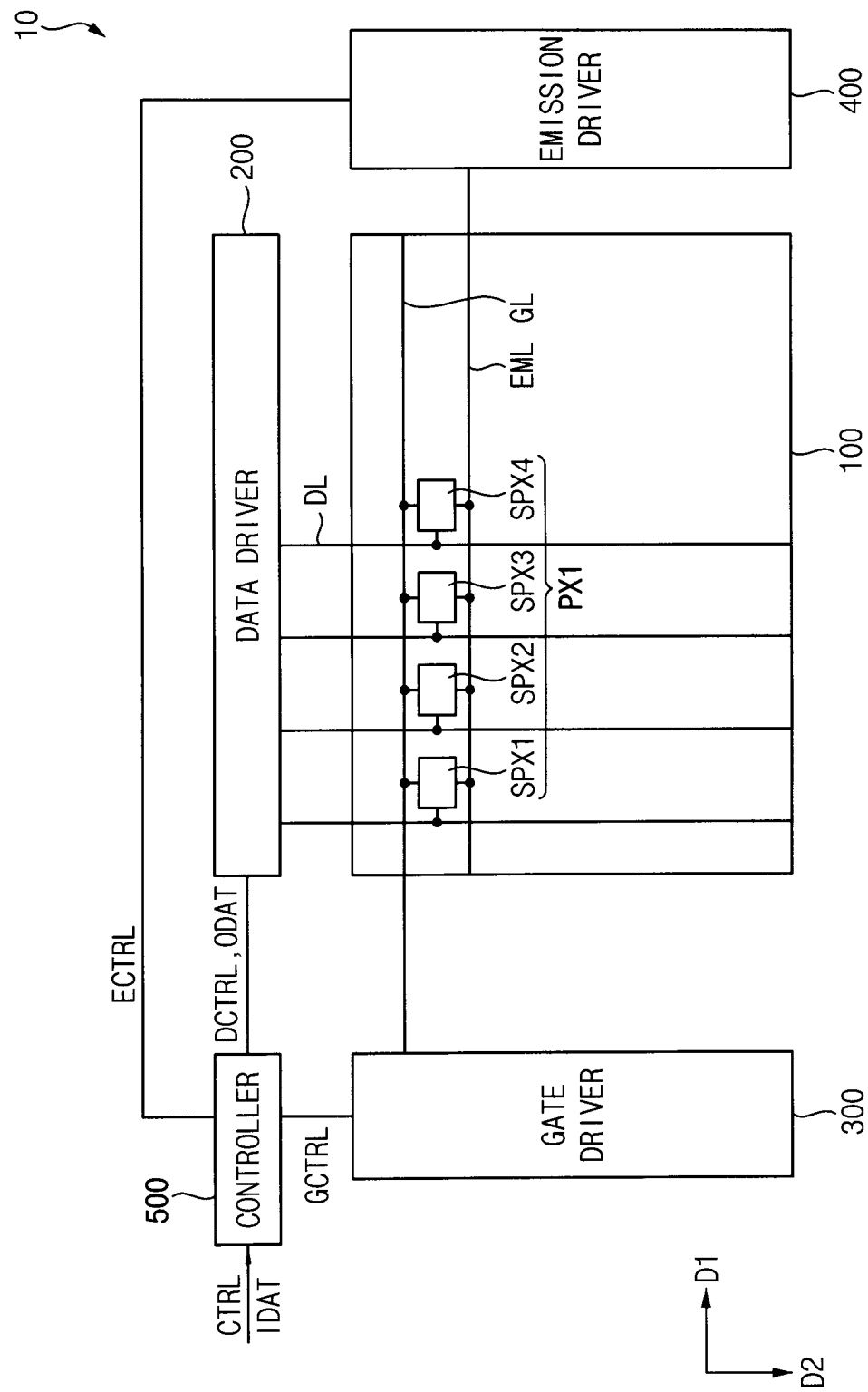
FIG. 2 is a block diagram illustrating the display device of FIG. 1.
Figure 3:
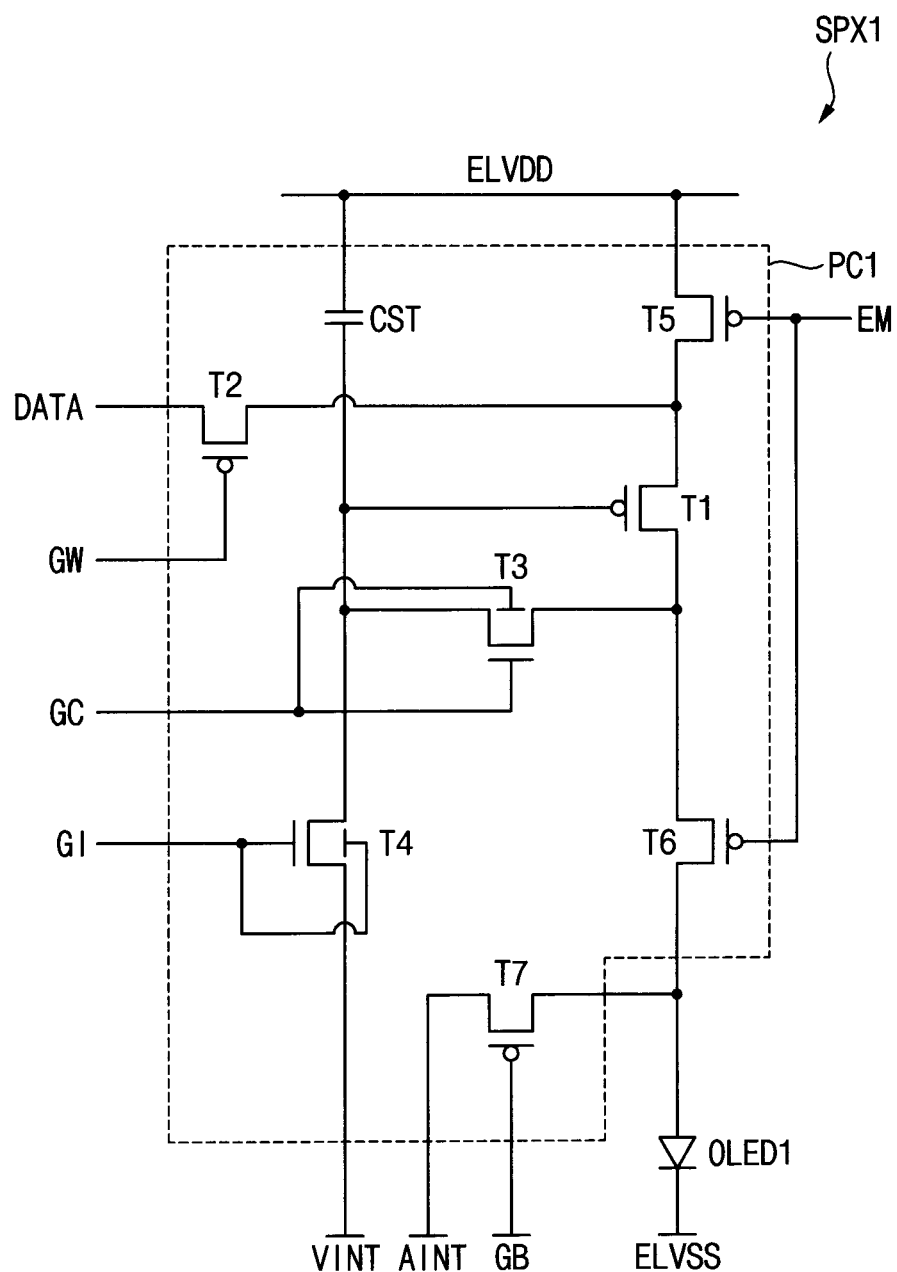
FIG. 3 is a circuit diagram illustrating an embodiment of a sub-pixel included in the display device of FIG. 2.

FIG. 1 is a plan view illustrating a display device according to an embodiment. FIG. 2 is a block diagram illustrating the display device of FIG. 1. FIG. 3 is a circuit diagram illustrating a pixel circuit and an organic light emitting diode included in the display device of FIG. 2.

Referring to FIGS. 1, 2, and 3, a display device 10 according to an embodiment may be divided into a display area DA, a non-display area NDA, and a fingerprint recognition area FA. For example, the display area DA may have a rectangular shape having a short side extending in a first direction D1 (i.e., latitudinal direction) and a long side extending in a second direction D2 (i.e., longitudinal direction) crossing the first direction D1. The non-display area NDA may be positioned to be around (e.g., to surround) the display area DA, and the display area DA may be positioned to be around (e.g., to surround) the fingerprint recognition area FA. A display panel 100 may be disposed in the display area DA and the fingerprint recognition area FA to display an image. A data driver 200, a gate driver 300, an emission control driver 400, and a timing controller 500 may be disposed in the non-display area NDA.

A first sub-pixel SPX1, a second sub-pixel SPX2, a third sub-pixel SPX3, and a fourth sub-pixel SPX4 may be disposed in the display panel 100. Each of the first to fourth sub-pixels SPX1, SPX2, SPX3, and SPX4 may be electrically connected to a data line DL, a gate line GL, and an emission control line EML. In some embodiments, the first to fourth sub-pixels SPX1, SPX2, SPX3, and SPX4 may constitute a first pixel PX1.

The data line DL may be electrically connected to the data driver 200 and may extend in the second direction D2. The data line DL may transmit a data voltage DATA.

The gate line GL may be connected to the gate driver 300 and may extend in the first direction D1. The gate line GL may transmit a gate signal GW, GC, GI, and GB.

The emission control line EML may be connected to the emission control driver 400 and may extend in the first direction D1. The emission control line EML may transmit an emission control signal EM. For example, an activation period of the emission control signal EM may be an emission period of the display device 10, and an inactivation period of the emission control signal EM may be a non-emission period of the display device 10.

The gate driver 300 may receive a gate control signal GCTRL from the timing controller 500 and may generate the gate signal. For example, the gate signal may include a first gate signal GW, a second gate signal GC, a third gate signal GI, and a fourth gate signal GB.

The data driver 200 may receive an output image data ODAT and a data control signal DCTRL from the timing controller 500 to generate the data voltage DATA. The emission control driver 400 may receive an emission drive control signal ECTRL from the timing controller 500 and may generate the emission control signal EM. The timing controller 500 may receive a control signal CTRL and an input image data DAT from an external device to control the data driver 200, the gate driver 300, and the emission control driver 400.

For example, the data driver 200 and the timing controller 500 may be disposed on a flexible printed circuit board, the gate driver 300 may be mounted in the non-display area NDA adjacent to a left side of the display area DA, and the emission control driver 400 may be mounted in the non-display area NDA adjacent to a right side of the display area DA. However, a structure in which the data driver 200, the gate driver 300, the emission control driver 400, and the timing controller 500 are disposed according to the present disclosure is not limited thereto.

The first sub-pixel SPX1 may include a first pixel circuit PC1 and a first organic light emitting diode OLED1. The first pixel circuit PC1 may provide a driving current to the first organic light emitting diode OLED1, and the first organic light emitting diode OLED1 may generate light based on the driving current. The second to fourth sub-pixels SPX2, SPX3, and SPX4 may have substantially the same circuit structure as that of the first sub-pixel SPX1.

The first pixel circuit PC1 may include a first transistor T1, a second transistor T2, a third transistor T3, a fourth transistor T4, a fifth transistor T5, a sixth transistor T6, a seventh transistor T7, and a storage capacitor CST.

The first organic light emitting diode OLED1 may include a first terminal (e.g., an anode terminal) and a second terminal (e.g., a cathode terminal), the first terminal of the first organic light emitting diode OLED1 may be connected to the sixth transistor T6 and the seventh transistor T7, and the second terminal may receive a common voltage ELVSS. The first organic light emitting diode OLED1 may generate light having a luminance corresponding to the driving current.

The storage capacitor CST may include a first terminal and a second terminal. The first terminal of the storage capacitor CST may be connected to the first transistor T1, and the second terminal of the storage capacitor CST may receive a power voltage ELVDD. The storage capacitor CST may maintain a voltage level of a gate terminal of the first transistor T1 during an inactive period of the first gate signal GW.

The first transistor T1 may include a gate terminal, a first terminal (e.g., a source terminal), and a second terminal (e.g., a drain terminal). The gate terminal of the first transistor T1 may be connected to the first terminal of the storage capacitor CST. The first terminal of the first transistor T1 may be connected to the second transistor T2 to receive the data voltage DATA. The second terminal of the first transistor T1 may be connected to the sixth transistor T6. The first transistor T1 may generate the driving current based on a voltage difference between the gate terminal and the first terminal. For example, the first transistor T1 may be referred to as a driving transistor.

The second transistor T2 may include a gate terminal, a first terminal (e.g., a source terminal), and a second terminal (e.g., a drain terminal). The gate terminal of the second transistor T2 may receive the first gate signal GW through the gate line GL.

The second transistor T2 may be turned on or off in response to the first gate signal GW. For example, when the second transistor T2 is a P-channel metal-oxide-semiconductor ("PMOS") transistor, the second transistor T2 may be turned off when the first gate signal GW has a positive voltage level, and may be turned on when the first gate signal GW has a negative voltage level. The first terminal of the second transistor T2 may receive the data voltage DATA through the data line DL. The second terminal of the second transistor T2 may provide the data voltage DATA to the first terminal of the first transistor T1 while the second transistor T2 is turned on. For example, the second transistor T2 may be referred to as a switching transistor.

The third transistor T3 may include a gate terminal, a back gate terminal, a first terminal (e.g., a source terminal), and a second terminal (e.g., a drain terminal). The gate terminal and the back gate terminal of the third transistor T3 may receive the second gate signal GC. The first terminal of the third transistor T3 may be connected to the second terminal of the first transistor T1. The second terminal of the third transistor T3 may be connected to the gate terminal of the first transistor T1.

The third transistor T3 may be turned on or off in response to the second gate signal GC. For example, when the third transistor T3 is an N-channel metal-oxide-semiconductor ("NMOS") transistor, the third transistor T3 may be turned on when the second gate signal GC has a positive voltage level, and may be turned off when the second gate signal GC has zero (ground) or a negative voltage level.

During a period in which the third transistor T3 is turned on in response to the second gate signal GC, the third transistor T3 may diode-connect the first transistor T1. The third transistor T3 may compensate for a threshold voltage of the first transistor T1. For example, the third transistor T3 may be referred to as a compensation transistor.

The fourth transistor T4 may include a gate terminal, a back gate terminal, a first terminal (e.g., a source terminal), and a second terminal (e.g., a drain terminal). The gate terminal and the back gate terminal of the fourth transistor T4 may receive the third gate signal GI. The first terminal of the fourth transistor T4 may be connected to the gate terminal of the first transistor T1. The second terminal of the fourth transistor T4 may receive a gate initialization voltage VINT.

The fourth transistor T4 may be turned on or off in response to the third gate signal GI. For example, when the fourth transistor T4 is the NMOS transistor, the fourth transistor T4 may be turned on when the third gate signal GI has a positive voltage level, and may be turned off when the third gate signal GI has zero or a negative voltage level, While the fourth transistor T4 is turned on in response to the third gate signal GI, the gate initialization voltage VINT may be provided to the gate terminal of the first transistor T1. Accordingly, the fourth transistor T4 may initialize the gate terminal of the first transistor T1 to the gate initialization voltage VINT. For example, the fourth transistor T4 may be referred to as a gate initialization transistor.

The fifth transistor T5 may include a gate terminal, a first terminal (e.g., a source terminal), and a second terminal (e.g., a drain terminal). The gate terminal of the fifth transistor T5 may receive the emission control signal EM. The first terminal of the fifth transistor T5 may receive the power voltage ELVDD. The second terminal of the fifth transistor T5 may be connected to the first terminal of the first transistor T1. When the fifth transistor T5 is turned on in response to the emission control signal EM, the fifth transistor T5 may provide the power voltage ELVDD to the first transistor T1.

The sixth transistor T6 may include a gate terminal, a first terminal (e.g., a source terminal), and a second terminal (e.g., a drain terminal). The gate terminal of the sixth transistor T6 may receive the emission control signal EM. The first terminal of the sixth transistor T6 may be connected to the first transistor T1. The second terminal of the sixth transistor T6 may be connected to the first organic light emitting diode OLED1. When the sixth transistor T6 is turned on in response to the emission control signal EM, the sixth transistor T6 may provide the driving current to the first organic light emitting diode OLED1.

The seventh transistor T7 may include a gate terminal, a first terminal (e.g., a source terminal), and a second terminal (e.g., a drain terminal). The gate terminal of the seventh transistor T7 may receive the fourth gate signal GB. The first terminal of the seventh transistor T7 may be connected to the first terminal of the first organic light emitting diode OLED1. The second terminal of the seventh transistor T7 may receive an anode initialization voltage AINT.

When the seventh transistor T7 is turned on in response to the fourth gate signal GB, the seventh transistor T7 may provide the anode initialization voltage AINT to the first organic light emitting diode OLED1. Accordingly, the seventh transistor T7 may initialize the first terminal of the first organic light emitting diode OLED1 to the anode initialization voltage AINT. For example, the seventh transistor T7 may be referred to as an initialization transistor.

In some embodiments, the first, second, fifth, sixth, and seventh transistors T1, T2, T5, T6, and T7 may be the PMOS transistors, and the third and fourth transistors T3 and T4 may be the NMOS transistors. Accordingly, active patterns of the PMOS transistors may include a silicon thin film doped with cations, and active patterns of the NMOS transistors may include an oxide semiconductor. In addition, the first gate signal GW, the emission control signal EM, and the fourth gate signal GB for turning on the second, fifth, sixth, and seventh transistors T2, T5, T6, and T7 may have negative voltage levels. The second gate signal GC and the third gate signal GI for turning on the third and fourth transistors T3 and T4 may have positive voltage levels.

A connection structure of the first pixel circuit PC1 shown in FIG. 3 is illustrative and may be variously changed.

Figure 4:
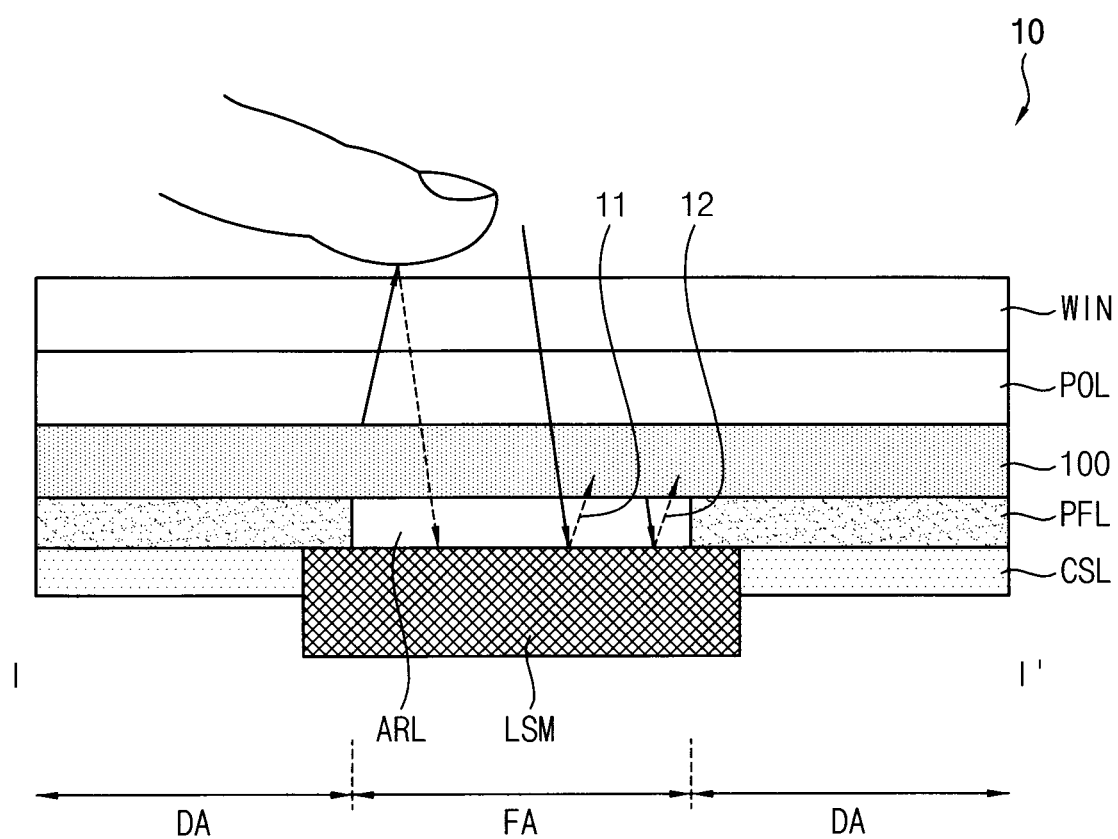
FIG. 4 is a cross-sectional view of an embodiment taken along line I-I' of FIG. 1.
Figure 5:
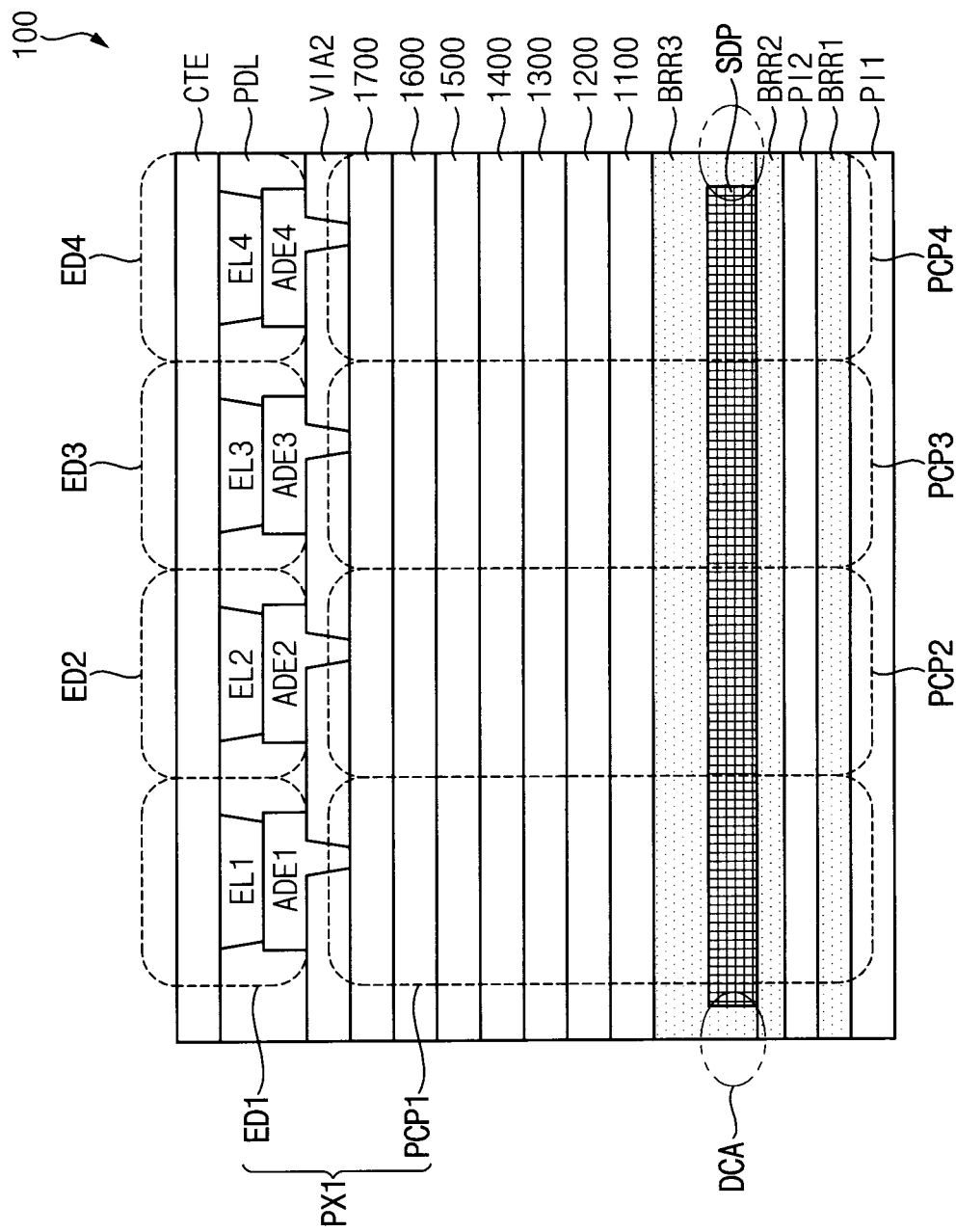
FIG. 5 is a cross-sectional view illustrating an embodiment of a display panel included in the display device of FIG. 1.
Figure 6:
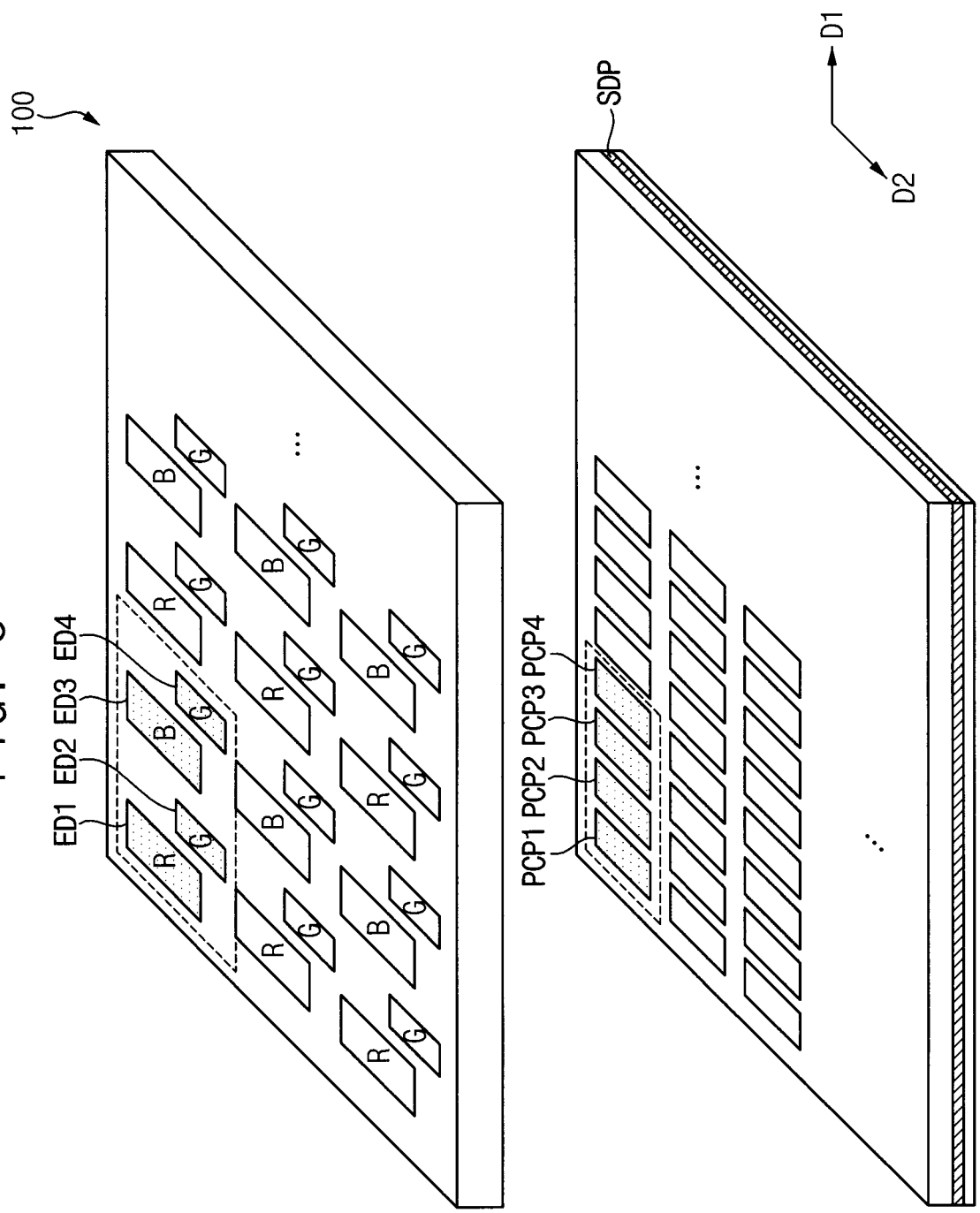
FIG. 6 is a perspective view illustrating an embodiment of a display panel included in the display device of FIG. 4.

FIG. 4 is a cross-sectional view of an embodiment taken along line I-I' of FIG. 1. FIG. 5 is a cross-sectional view illustrating an embodiment of a display panel included in the display device of FIG. 1. FIG. 6 is a perspective view illustrating an embodiment of a display panel included in the display device of FIG. 4.

Referring to FIGS. 1 and 4, the display device 10 may include the display panel 100, an optical sensor module LSM, and various functional layers disposed above or below the display panel 100. For example, the functional layers may include a cushion layer CSL, a protective film PFL, an air layer ARL, a polarizing plate POL, and a window WIN. In addition, an adhesive layer may be disposed between the functional layers CSL, PFL, ARL, POL, and WIN, and the adhesive layer may be an optically clear adhesive ("OCA").

The display panel 100 may overlap the display area DA and the fingerprint recognition area FA in a plan view. As described above, the display panel 100 may include the first to fourth sub-pixels SPX1, SPX2, SPX3, and SPX4. For example, the first to fourth sub-pixels SPX1, SPX2, SPX3, and SPX4 may overlap the fingerprint recognition area FA.

The protective film PFL may be disposed under the display panel 100. The protective film PFL may overlap the display area DA and may not overlap the fingerprint recognition area FA in a plan view. In other words, an opening overlapping the fingerprint recognition area FA in a plan view may be defined by the protective film PFL. The protective film PFL may include a plastic material and may support the display panel 100.

The air layer ARL may be disposed under the display panel 100. The air layer ARL may be filled with air. The air layer ARL may overlap the fingerprint recognition area FA and may not overlap the display area DA in a plan view. For example, the air layer ARL may be defined by the opening. Light may be smoothly transmitted to the optical sensor module LSM through the air layer ARL.

The cushion layer CSL may be disposed under the protective film PFL. The cushion layer CSL may overlap the display area DA and may not overlap the fingerprint recognition area FA in a plan view. In other words, an opening overlapping the fingerprint recognition area FA may be defined by the cushion layer CSL. The cushion layer CSL may include an elastic body and may protect the display panel 100 from external impact.

The optical sensor module LSM may be disposed under the protective film PFL. The optical sensor module LSM may overlap the fingerprint recognition area FA in a plan view. In other words, the optical sensor module LSM may be disposed in the opening defined by the cushion layer CSL. The optical sensor module LSM may recognize a user's fingerprint. For example, light emitted from the display panel 100 may be reflected by the user's finger on the window WIN, and the optical sensor module LSM may detect the light reflected from the finger. In order for the optical sensor module LSM to detect light, the optical sensor module LSM may be exposed by the air layer ARL.

The polarization layer POL may be disposed on the display panel 100. The polarizing layer POL may reduce reflection of external light.

The window WIN may be disposed on the polarizing layer POL. The window WIN may be made of glass, plastic, or the like, and may protect the display panel 100 from external impact.

As the air layer ARL is defined under the display panel 100, light reflected from the fingerprint recognition area FA may be incident on the display panel 100. For example, a light 11 incident from the outside and reflected from the optical sensor module LSM and/or a light 12 emitted from the display panel 100 and reflected from the optical sensor module LSM may be incident to the display panel 100.

Referring to FIGS. 5 and 6, the display panel 100 may include first to fourth pixel circuit parts PCP1, PCP2, PCP3, and PCP4, and first to fourth emitting diodes ED1, ED2, ED3, and ED4.

In some embodiments, the first pixel circuit part PCP1 and the first emitting diode ED1 may constitute the first sub-pixel SPX1. For example, the first pixel circuit part PCP1 may correspond to the first pixel circuit PC1, and the first emitting diode ED1 may correspond to the first organic light emitting diode OLED1. In other words, the transistors may be formed in the first pixel circuit part PCP1, and the driving current may be provided to the first emitting diode ED1.

In addition, the second pixel circuit part PCP2 and the second emitting diode ED2 may constitute the second sub-pixel SPX2, the third pixel circuit part PCP3 and the third emitting diode ED3 may constitute the third sub-pixel SPX3, and the fourth pixel circuit part PCP4 and the fourth emitting diode ED4 may constitute the fourth sub-pixel SPX4. Accordingly, the first to fourth pixel circuit parts PCP1, PCP2, PCP3 and PCP4 and the first to fourth emitting diodes ED1, ED2, ED3, and ED4 may constitute the first pixel PX1.

The first emitting diode ED1 may include a first pixel electrode ADE1, a first emission layer EL1, and a common electrode CTE. For example, the first emission layer EL1 may generate red light. The second emitting diode ED2 may include a second pixel electrode ADE2, a second emission layer EL2, and the common electrode CTE. For example, the second emission layer EL2 may generate green light. The third emitting diode ED3 may include a third pixel electrode ADE3, a third emission layer EL3, and the common electrode CTE. For example, the third emission layer EL3 may generate blue light. The fourth emitting diode ED4 may include a fourth pixel electrode ADE4, a fourth emission layer EL4, and the common electrode CTE. For example, the fourth emission layer EL4 may generate green light.

The first pixel circuit part PCP1 may include a first organic film layer PI1, a first barrier layer BRR1, a second organic film layer PI2, a second barrier layer BRR2, a lower pattern SDP, a third barrier layer BRR3, a first active pattern 1100, a first conductive pattern 1200, a second conductive pattern 1300, a second active pattern 1400, a third conductive pattern 1500, a fourth conductive pattern 1600, and a fifth conductive pattern 1700. For example, each of the first and second organic film layers PI1 and PI2 may be referred to as a substrate of the display panel 100. Insulation layers may be disposed between the first active pattern 1100 to the fifth conductive pattern 1700. In addition, a second via insulating layer VIA2 may be disposed on the fifth conductive pattern 1700, and the first to fourth pixel electrodes ADE1, ADE2, ADE3, and ADE4 may be respectively connected to the fifth conductive pattern 1700 through contact holes passing through the second via insulating layer VIA2.

A related art display device includes a display panel and transistors including active patterns that are disposed in the display panel. An electric field may be generated inside the display panel due to signals and voltages provided to the display panel. Organic materials included in an organic film layer of the display panel may be polarized by the electric field. The polarized organic materials may have an electrical effect on the active patterns of the display panel. Accordingly, electrical characteristics of the transistors may be changed. In addition, a polarization phenomenon may be further accelerated by light incident on the display panel. Therefore, a display quality of the related art display device may be deteriorated.

However, the display device 10 may include the lower pattern SDP disposed inside the display panel 100. The lower pattern SDP may prevent or protect the polarization from having an electrical effect on the first and second active patterns 1100 and 1400. Accordingly, electrical characteristics of the transistors may not be changed. Accordingly, display quality of the display device 10 may be improved, and will be described in more detail below.

FIG. 7 to FIG. 18 are layout diagrams illustrating an embodiment of the display device of FIG. 1. FIG. 19 is a cross-sectional view illustrating an example taken along line II-II' of FIG. 18. FIG. 20 is a cross-sectional view illustrating an example taken along line III-III' of FIG. 18.

Figure 7:
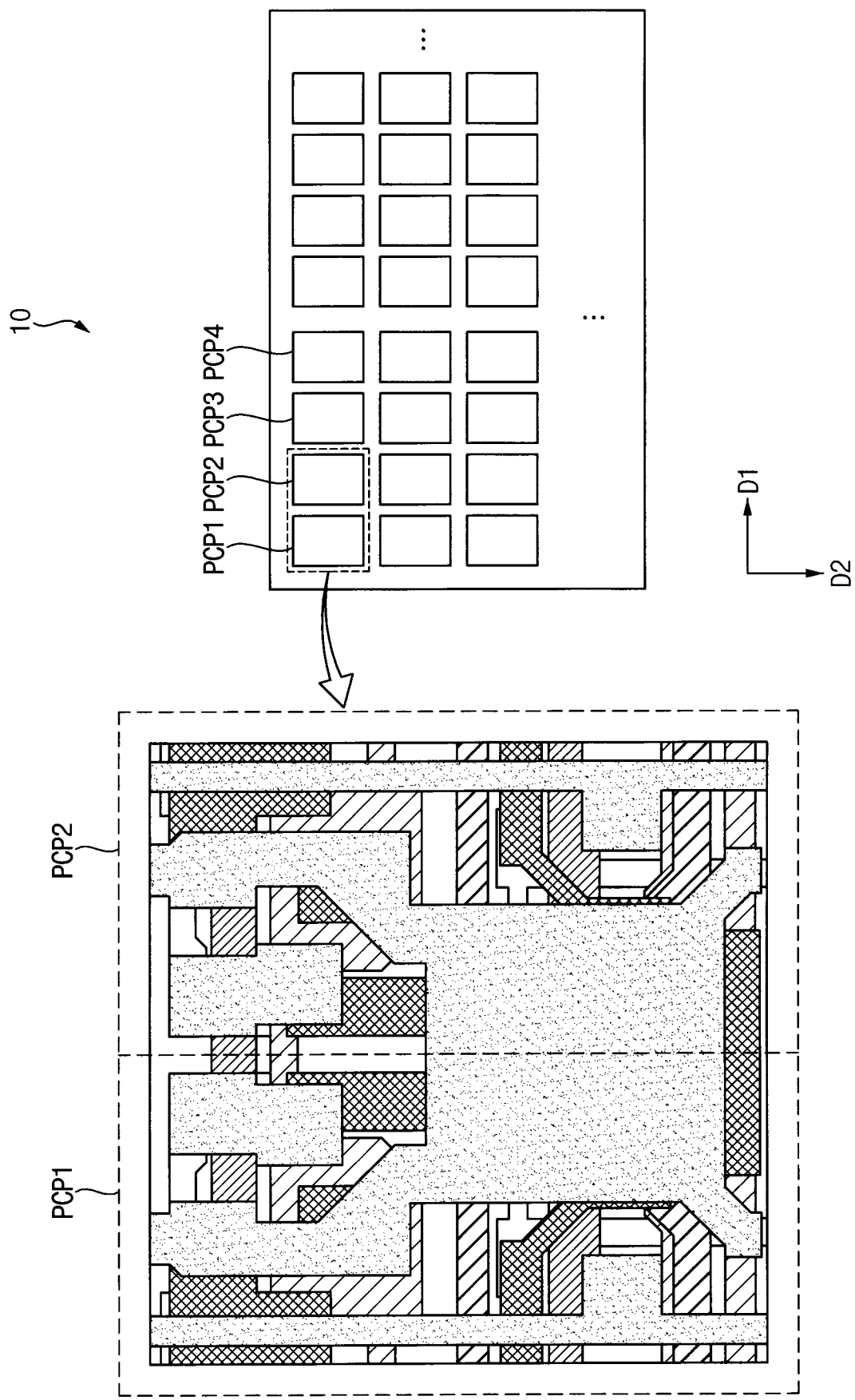
FIG. 7-FIG. 18 are layout diagrams illustrating an embodiment of the display device of FIG. 1.

Referring to FIG. 7, the display device 10 may include a plurality of pixel circuit parts arranged in a matrix shape. For example, the display device 10 may include the first to fourth pixel circuit parts PCP1, PCP2, PCP3, and PCP4 arranged with each other in the first direction D1. In some embodiments, the second pixel circuit part PCP2 may have a shape symmetrical with a shape of the first pixel circuit part PCP1. In addition, the third pixel circuit part PCP3 may have the same shape as the first pixel circuit part PCP1, and the fourth pixel circuit part PCP4 may have a shape symmetrical with the shape of the third pixel circuit part PCP3.

Referring to FIGS. 8, 9, 10, 11, and 19, the first pixel circuit part PCP1 may include the first organic film layer PI1, the first barrier layer BRR1, the second organic film layer PI2, the second barrier layer BRR2, the lower pattern SDP, and the third barrier layer BRR3, as shown in FIG. 5.

The first organic film layer PI1 may include an organic material. For example, the first organic film layer PI1 may include polyimide.

The first barrier layer BRR1 may be disposed on the first organic film layer PI1. The first barrier layer BRR1 may include an inorganic material. For example, the first barrier layer BRR1 may include silicon oxide, silicon nitride, amorphous silicon, and/or one or more other suitable materials.

The second organic film layer PI2 may be disposed on the first barrier layer BRR1. For example, the second organic film layer PI2 may include the same material as the first organic film layer PI1.

The second barrier layer BRR2 may be disposed on the second organic film layer PI2. The second barrier layer BRR2 may include the same material as the first barrier layer BRR1. The second barrier layer BRR2 may protect the second organic film layer PI2, which may be damaged in the process of forming the lower pattern SDP.

In some embodiments, the lower pattern SDP may be disposed between the second organic film layer PI2 and the first active pattern 1100. For example, the lower pattern SDP may be disposed on the second barrier layer BRR2.

In some embodiments, the lower pattern SDP may include metal. For example, the lower pattern SDP may include the same metal as the first conductive pattern 1200 (e.g., the lower pattern and the gate electrode are composed of the same metal or are the same in metal.

In other embodiments, the lower pattern SDP may include a silicon semiconductor. For example, the lower pattern SDP may include amorphous silicon and/or polycrystalline silicon. In addition, the lower pattern SDP may be doped with positive (cation) and/or negative (anion) ions. For example, the cation may be a group III element (e.g., boron and/or the like). The anion may be a group V element (e.g., phosphorus and/or the like).

In some embodiments, the lower pattern SDP may be electrically floating. In another embodiment, a constant voltage may be provided to the lower pattern SDP. In another embodiment, an AC voltage may be provided to the lower pattern SDP.

Figure 10:
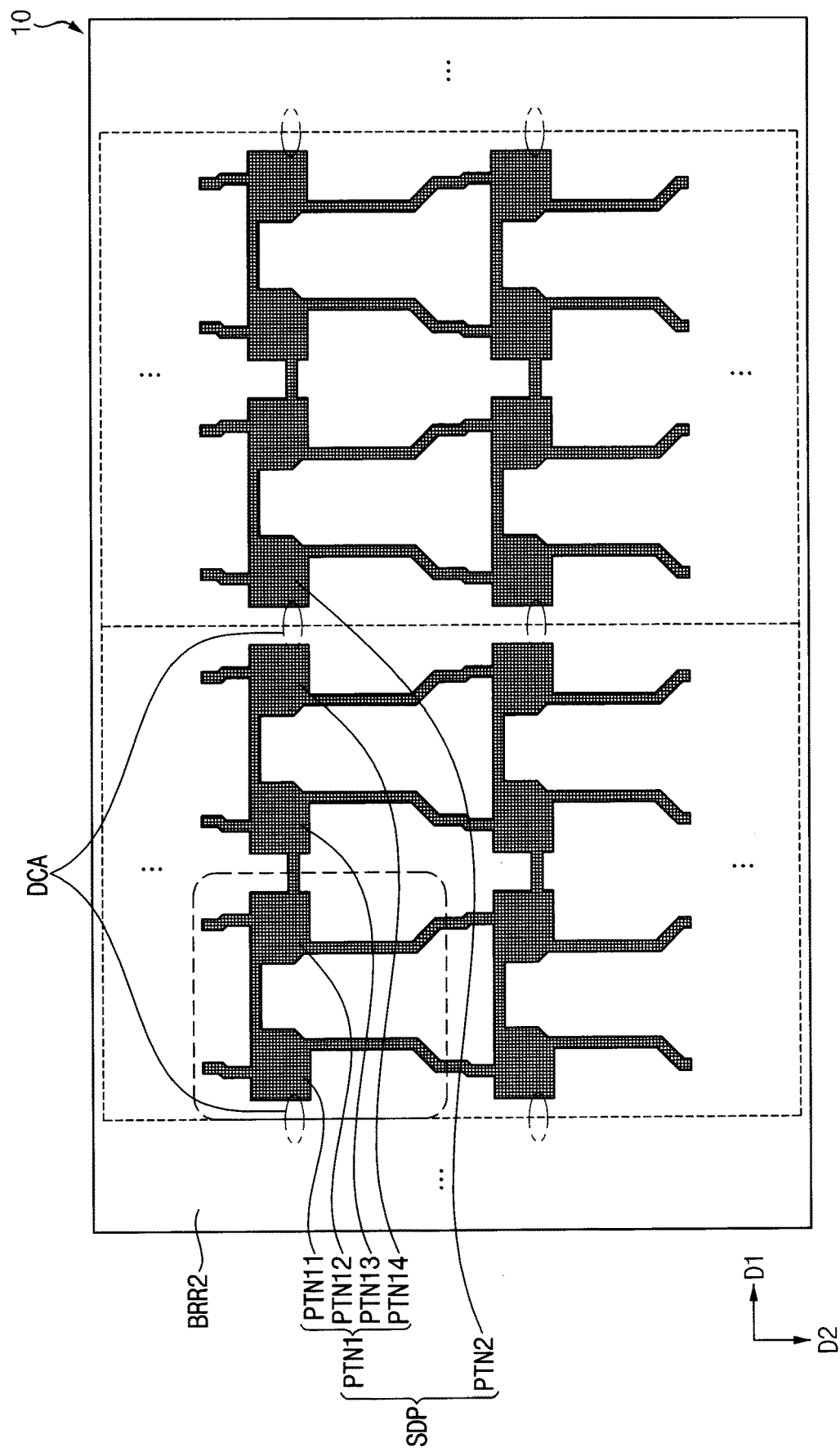
Figure 11:
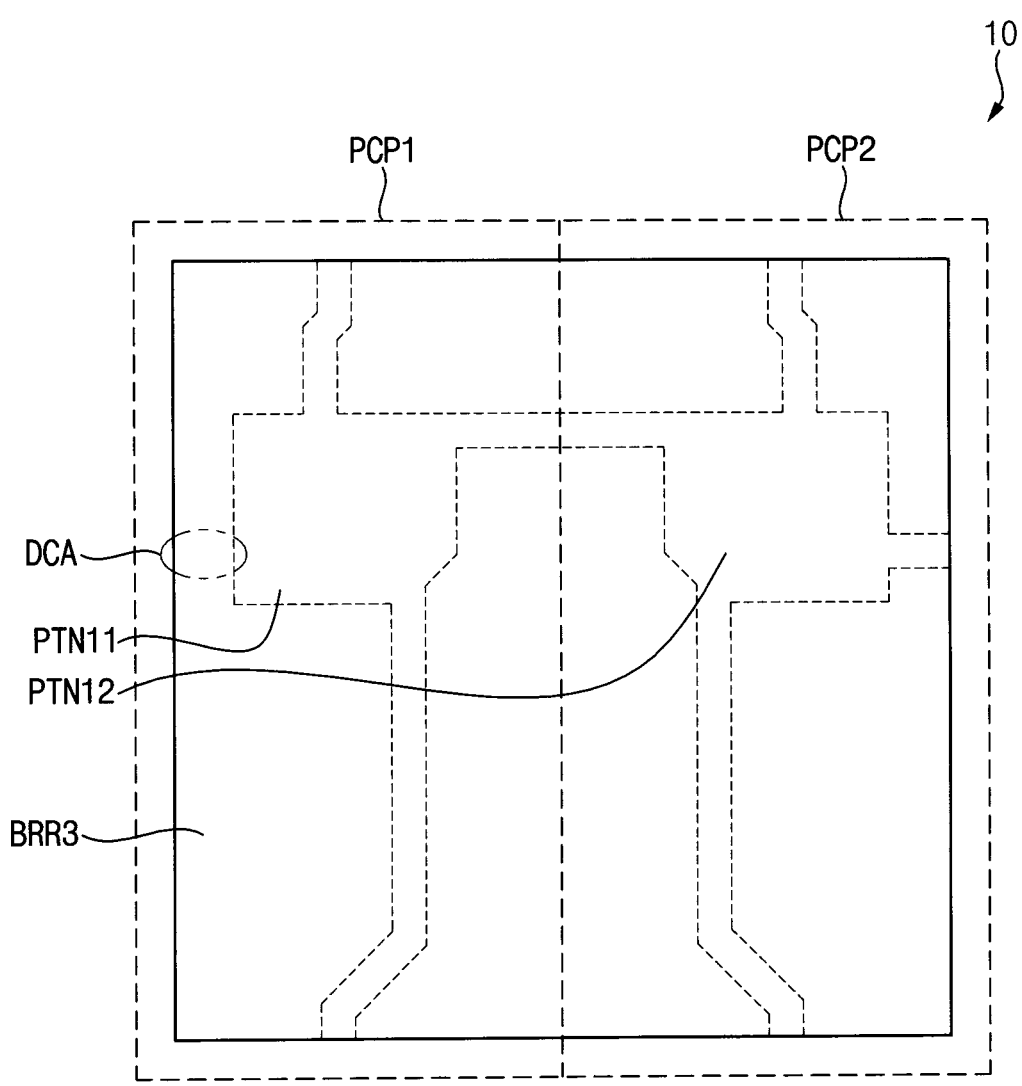

In some embodiments, for example, as shown in FIG. 10, the lower pattern SDP may have a mesh shape defining a disconnection area DCA.

In some embodiments, the lower pattern SDP may include a first pattern PTN1 and a second pattern PTN2. The first pattern PTN1 may extend in the second direction D2. The second pattern PTN2 may extend in the second direction D2 and may be spaced apart from the first pattern PTN1 in the first direction D1. For example, a shape of the first pattern PTN1 and a shape of the second pattern PTN2 may be the same.

In some embodiments, the first pattern PTN1 and the second pattern PTN2 may not be connected to each other. In other words, the first pattern PTN1 and the second pattern PTN2 may be disconnected from each other. For example, the disconnection area DCA may be positioned between the first pattern PTN1 and the second pattern PTN2.

In more detail, the disconnection area DCA may be an area in which the first pattern PTN1 and the second pattern PTN2 are disconnected from each other. In other words, the lower pattern SDP may be partially removed from the disconnection area DCA. Accordingly, the second barrier layer BRR2 may contact the third barrier layer BRR3 in the disconnection area DCA.

In some embodiments, the first pattern PTN1 may include a first auxiliary pattern PTN11, a second auxiliary pattern PTN12, a third auxiliary pattern PTN13, and a fourth auxiliary pattern PTN14.

The first auxiliary pattern PTN11 may include a first portion PRT1 overlapping a first gate electrode (e.g., a first gate electrode 1221 shown in FIG. 13) and a second portion PRT2 extending in the second direction D2.

A second shape of the second auxiliary pattern PTN12 may be symmetrical with a first shape of the first auxiliary pattern PTN11 in the first direction D1. The first auxiliary pattern PTN11 and the second auxiliary pattern PTN12 may be connected to each other through a first bridge BRD1 extending in the first direction D1.

A third shape of the third auxiliary pattern PTN13 may be the same as the first shape. The second auxiliary pattern PTN12 and the third auxiliary pattern PTN13 may be connected to each other through a second bridge BRD2 extending in the first direction D1.

A fourth shape of the fourth auxiliary pattern PTN14 may be the same as the second shape and may be symmetrical with the third shape in the first direction D1. The third auxiliary pattern PTN13 and the fourth auxiliary pattern PTN14 may be connected to each other through the first bridge BRD1. In other words, the first to fourth auxiliary patterns PTN11, PTN12, PTN13, and PTN14 may be connected to each other through the first and second bridges BRD1 and BRD2.

The first portion PRT1 of the first auxiliary pattern PTN11 may completely overlap the first gate electrode 1221 (e.g., in a plan view). For example, a shape of the first portion PRT1 may be substantially the same as a shape of the first gate electrode 1221, and a size of the first portion PRT1 may be greater than or equal to a size of the first gate electrode 1221.

The second portion PRT2 of the first auxiliary pattern PTN11 may overlap a power voltage line (e.g., a power voltage line 1720 of FIG. 18) to be described later in more detail. For example, the second portion PRT2 may be disposed along the power voltage line 1720.

Figure 13:
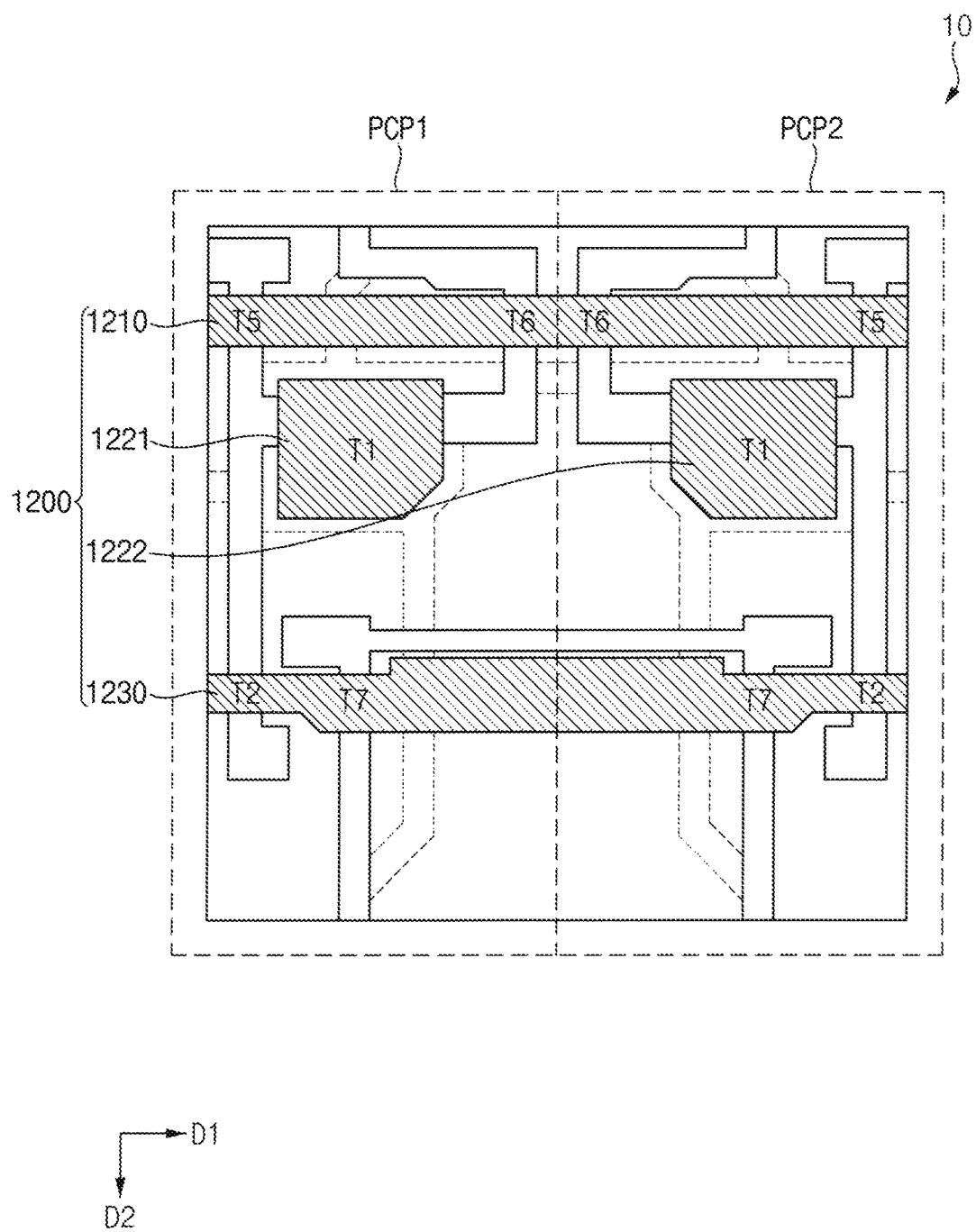

The first portion PRT1 of the second auxiliary pattern PTN12 may completely overlap a second gate electrode (e.g., a second gate electrode 1222 shown in FIG. 13). For example, a shape of the first portion PRT1 may be substantially the same as a shape of the second gate electrode 1222, and a size of the first portion PRT1 may be greater than or equal to a size of the second gate electrode 1222.

The second portion PRT2 of the second auxiliary pattern PTN12 may overlap the power voltage line. For example, the second portion PRT2 may be disposed along the power voltage line 1720.

The third barrier layer BRR3 may cover the lower pattern SDP and may be disposed on the second barrier layer BRR2. The third barrier layer BRR3 may include the same material as the first barrier layer BRR1. In addition, as described above, the third barrier layer BRR3 may contact the second barrier layer BRR2 in the disconnection area DCA.

Figure 12:
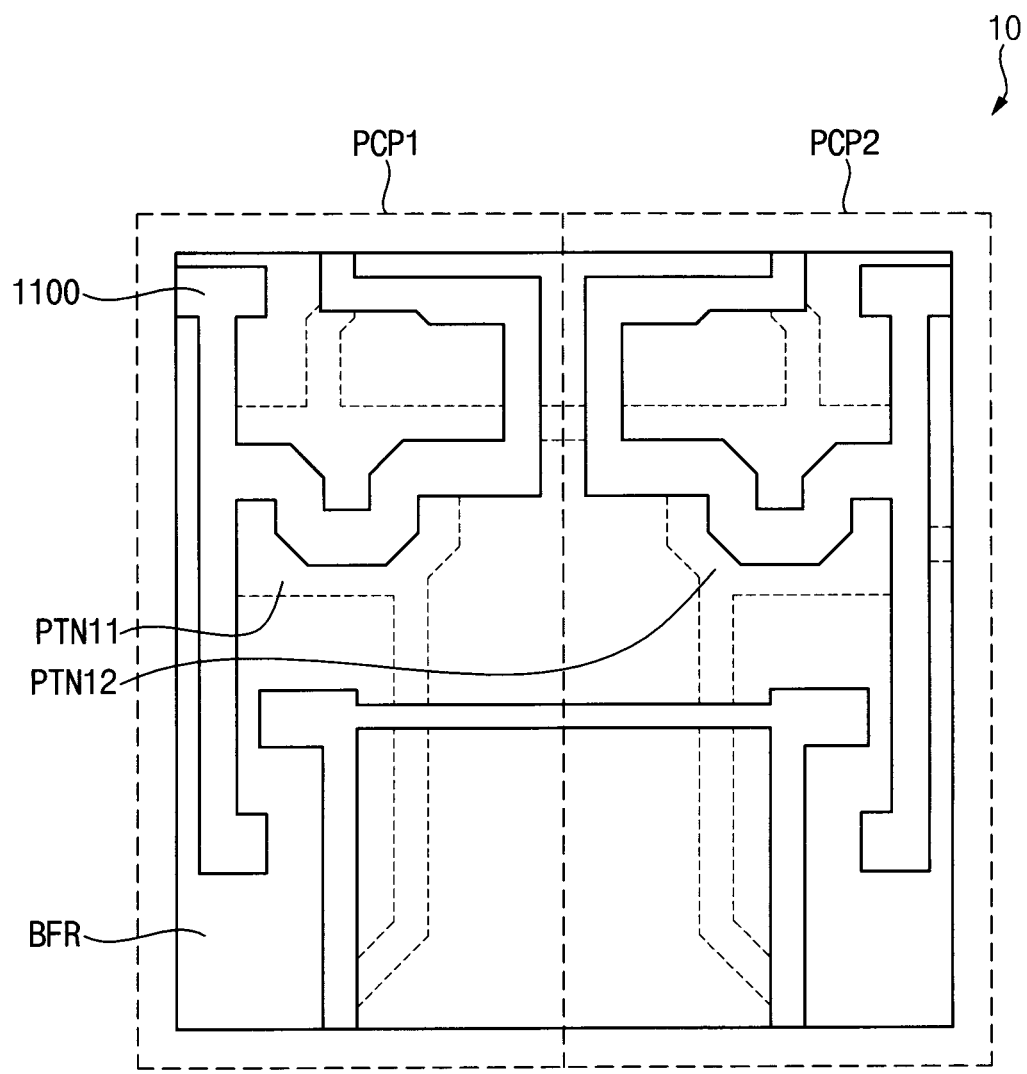

A buffer layer BFR may be disposed on the third barrier layer BRR3, as shown in FIG. 12. The buffer layer BFR may prevent or reduce diffusion of metal atoms and/or impurities into the first active pattern 1100. In addition, the buffer layer BFR may help the first active pattern 1100 to be uniformly formed by controlling a heat supply rate during a crystallization process for forming the first active pattern 1100.

Referring to FIGS. 12 and 19, the first active pattern 1100 may be disposed on the buffer layer BFR. The first active pattern 1100 may overlap the lower pattern SDP. In some embodiments, the first active pattern 1100 may include a silicon semiconductor. For example, the first active pattern 1100 may include amorphous silicon, polycrystalline silicon, and/or one or more other suitable materials.

In some embodiments, cations and/or anions may be selectively doped to the first active pattern 1100. For example, when the first, second, fifth, sixth, and seventh transistors T1, T2, T5, T6, and T7 are the PMOS transistors, the first active pattern 1100 may include a source region having a high cation concentration, a drain region having a high cation concentration, and a channel region having a low cation concentration.

A first gate insulating layer GI1 may cover the first active pattern 1100 and may be disposed on the buffer layer BFR. The first gate insulating layer GI1 may include an insulating material. For example, the first gate insulating layer GI1 may include silicon oxide, silicon nitride, titanium oxide, tantalum oxide, and/or one or more other suitable materials.

Referring to FIGS. 13 and 19, a first conductive pattern 1200 may be disposed on the first gate insulating layer GI1. The first conductive pattern 1200 may include a first gate line 1210, a first gate electrode 1221, a second gate electrode 1222, and a third gate line 1230.

The first gate line 1210 may be disposed on the first active pattern 1100 and may extend in the first direction D1. In some embodiments, the first gate line 1210 may be adjacent to a first side of the first gate electrode 1221 on a plane (e.g., in a plan view). The first gate line 1210 may constitute the fifth and sixth transistors T5 and T6 together with the first active pattern 1100. The emission control signal EM may be provided to the first gate line 1210. For example, the first gate line 1210 may be referred to as an emission control line.

The first gate electrode 1221 and the second gate electrode 1222 may be arranged in the first direction D1. In addition, as shown in FIG. 6, the first to fourth pixel circuit parts PCP1, PCP2, PCP3, and PCP4 may be arranged in the first direction D1. Accordingly, the first gate electrode 1221, the second gate electrode 1222, the third gate electrode included in the third pixel circuit part PCP3, and the fourth gate electrode included in the fourth circuit part PCP4 may be arranged in the first direction D1.

The first gate electrode 1221 may overlap the first portion PRT1 of the first pattern PTN1 and the first active pattern 1100. The first gate electrode 1221 may constitute the first transistor T1 of the first sub-pixel SPX1 together with the first active pattern 1100.

The second gate electrode 1222 may be spaced apart from the first gate electrode 1221 in the first direction D1. The second gate electrode 1222 may overlap the second pattern PTN2 and the first active pattern 1100. The second gate electrode 1222 may form the first transistor T1 of the second sub-pixel SPX2 together with the first active pattern 1100.

The third gate line 1230 may be disposed on the first active pattern 1100 and may extend in the first direction D1. For example, the third gate line 1230 may form the second transistor T2 together with the first active pattern 1100. The first gate signal GW may be provided to the third gate line 1230.

In addition, the third gate line 1230 may constitute the seventh transistor T7 together with the first active pattern 1100. The fourth gate signal GB may be provided to the third gate line 1230. For example, the first gate signal GW and the fourth gate signal GB may have substantially the same waveform with a time difference.

In some embodiments, the first conductive pattern 1200 may include a metal, an alloy, a conductive metal oxide, a transparent conductive material, and/or one or more other suitable materials. For example, the first conductive pattern 1200 may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and/or the like.

A second gate insulating layer GI2 may cover the first conductive pattern 1200 and may be disposed on the first gate insulating layer GI1. The second gate insulating layer Gi2 may include an insulating material.

The first, second, fifth, sixth, and seventh transistors T1, T2, T5, T6, and T7 may be substantially the same as the first, second, fifth, sixth and seventh transistors T1, T2, T5, T6, and T7 described with reference to FIG. 3. For example, the gate electrode 1221 may correspond to the gate terminal of the first transistor T1 described with reference to FIG. 3. However, this correspondence relationship will not be described in detail, and may be apparent to those skilled in the art to which the present disclosure pertains.

Figure 14:
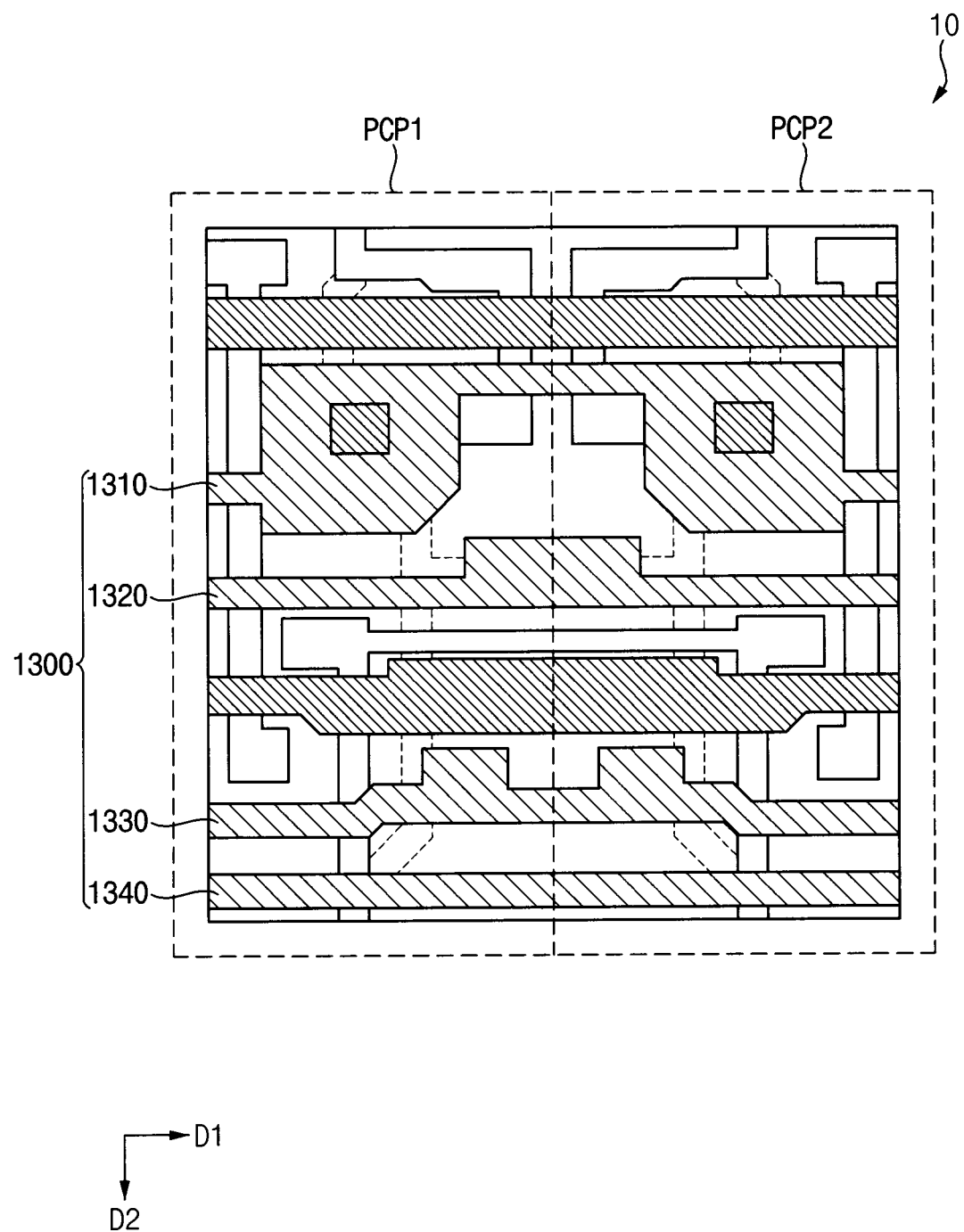

Referring to FIGS. 14 and 19, a second conductive pattern 1300 may be disposed on the second gate insulating layer GI2. The second conductive pattern 1300 may include a storage capacitor electrode 1310, a fourth gate line 1320, a fifth gate line 1330, and a gate initialization voltage line 1340.

The storage capacitor electrode 1310 may extend in the first direction D1. In some embodiments, the storage capacitor electrode 1310 may constitute the storage capacitor CST included in the first pixel circuit part PCP1 together with the first gate electrode 1221. For example, the storage capacitor electrode 1310 may overlap the first gate electrode 1221, and the power voltage ELVDD may be provided to the storage capacitor electrode 1310. In addition, the storage capacitor electrode 1310 may form the storage capacitor CST included in the second pixel circuit part PCP2 together with the second gate electrode 1222. For example, the storage capacitor electrode 1310 may overlap the second gate electrode 1222.

In some embodiments, openings exposing top surfaces of the first and second gate electrodes 1221 and 1222 may be formed in the storage capacitor electrode 1310.

The fourth gate line 1320 may extend in the first direction D1. In some embodiments, the fourth gate line 1320 may be adjacent to a second side opposite to the first side of the first gate electrode 1221 on a plane. In some embodiments, the fourth gate line 1320 may provide the second gate signal GC to the third transistor T3. For example, the fourth gate line 1320 may correspond to the back gate terminal of the third transistor T3. The fourth gate line 1320 may be referred to as a lower compensation control line.

The fifth gate line 1330 may extend in the first direction D1. In some embodiments, the fifth gate line 1330 may provide the third gate signal GI to the fourth transistor T4. For example, the fifth gate line 1330 may correspond to the back gate terminal of the fourth transistor T4.

The gate initialization voltage line 1340 may extend in the first direction D1. In some embodiments, the gate initialization voltage line 1340 may provide the gate initialization voltage VINT to the fourth transistor T4. For example, the gate initialization voltage line 1340 may be electrically connected to the second active pattern 1400.

For example, the second conductive pattern 1300 may include a metal, an alloy, a conductive metal oxide, a transparent conductive material, and/or one or more other suitable materials.

A first interlayer insulating layer ILD1 may cover the second conductive pattern 1300 and may be disposed on the second gate insulating layer GI2. The first interlayer insulating layer ILD1 may include an insulating material.

Figure 15:
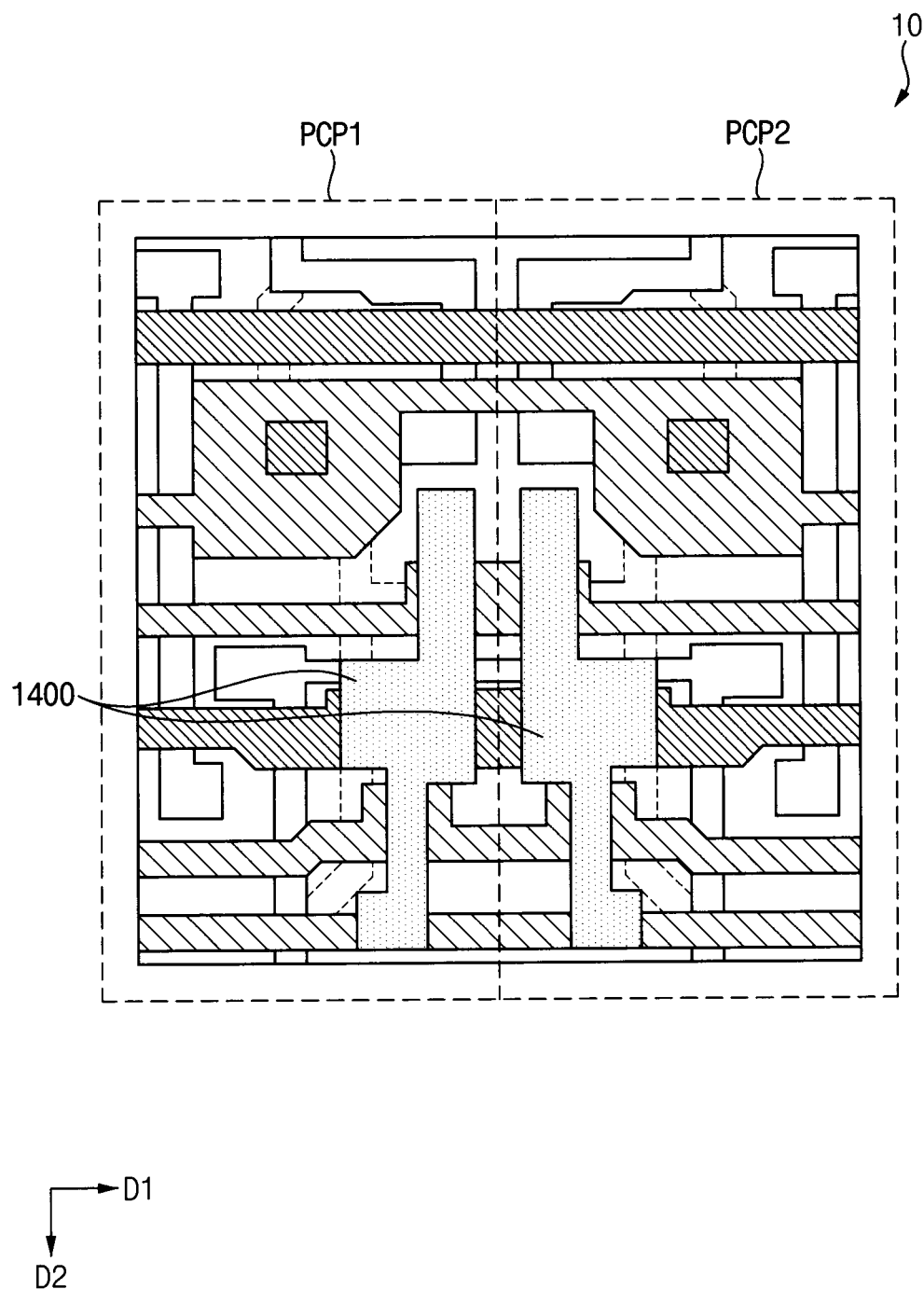

Referring to FIGS. 15 and 19, the second active pattern 1400 may be disposed on the first interlayer insulating layer ILD1. For example, the second active pattern 1400 may overlap the fourth gate line 1320, the fifth gate line 1330, and the gate initialization line 1340.

In some embodiments, the second active pattern 1400 may be disposed on a different layer from the first active pattern 1100 and may not overlap the first active pattern 1100. In other words, the second active pattern 1400 may be formed separately from the first active pattern 1100. For example, the first active pattern 1100 may include the silicon semiconductor, and the second active pattern 1400 may include an oxide semiconductor.

In some embodiments, the first pixel circuit part PCP1 may include the first, second, fifth, sixth and seventh transistors T1, T2, T5, T6, and T7 which are silicon-based semiconductor transistors, and the third and fourth transistors T3 and T4 which are oxide-based semiconductor transistors. For example, the first, second, fifth, sixth, and seventh transistors T1, T2, T5, T6, and T7 are the PMOS transistors and the third and fourth transistors T3 and T4 may be the NMOS transistors.

A third gate insulating layer GI3 may cover the second active pattern 1400 and may be disposed on the first interlayer insulating layer ILD1. The third gate insulating layer GI3 may include an insulating material.

Figure 16:
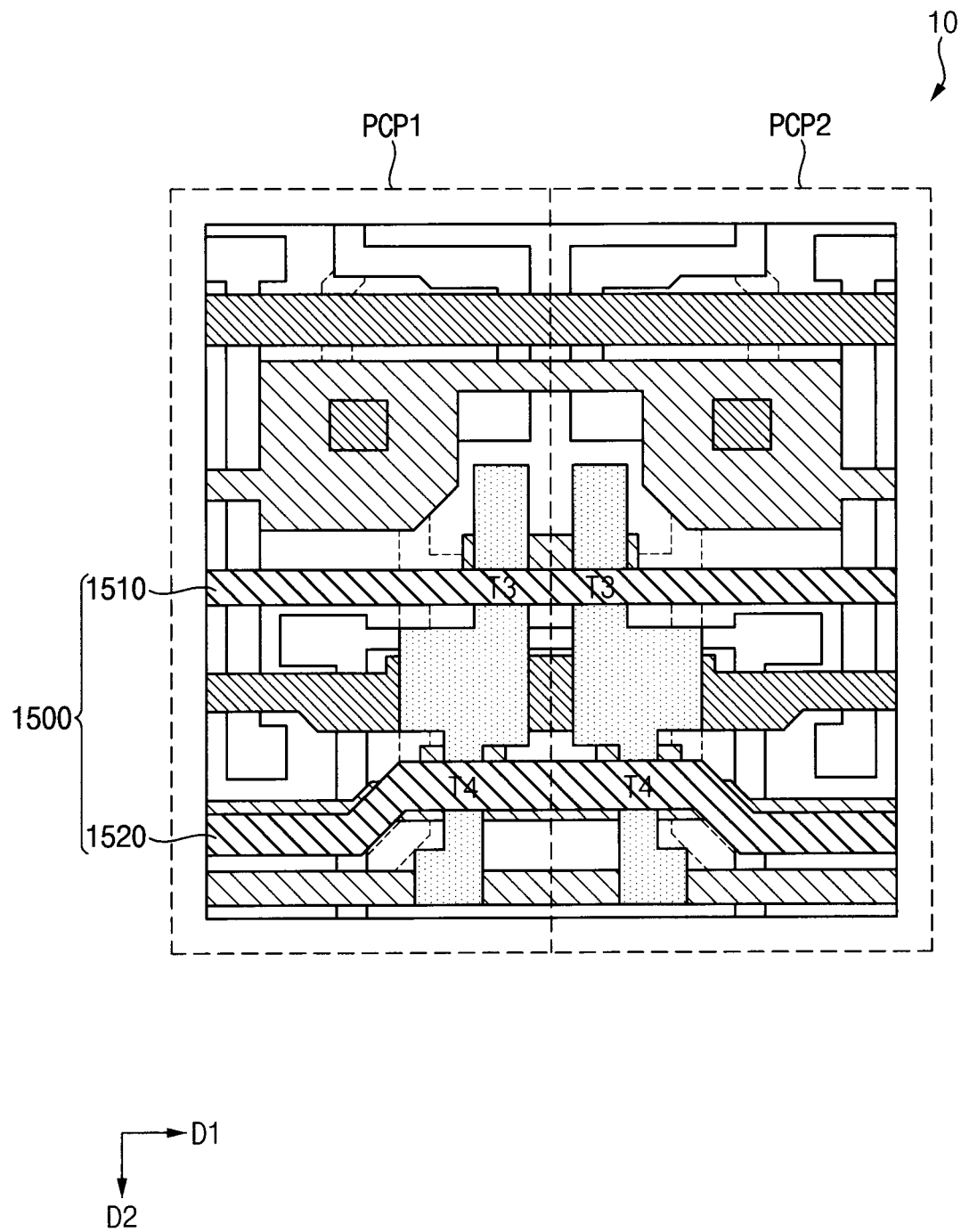
Figure 17:
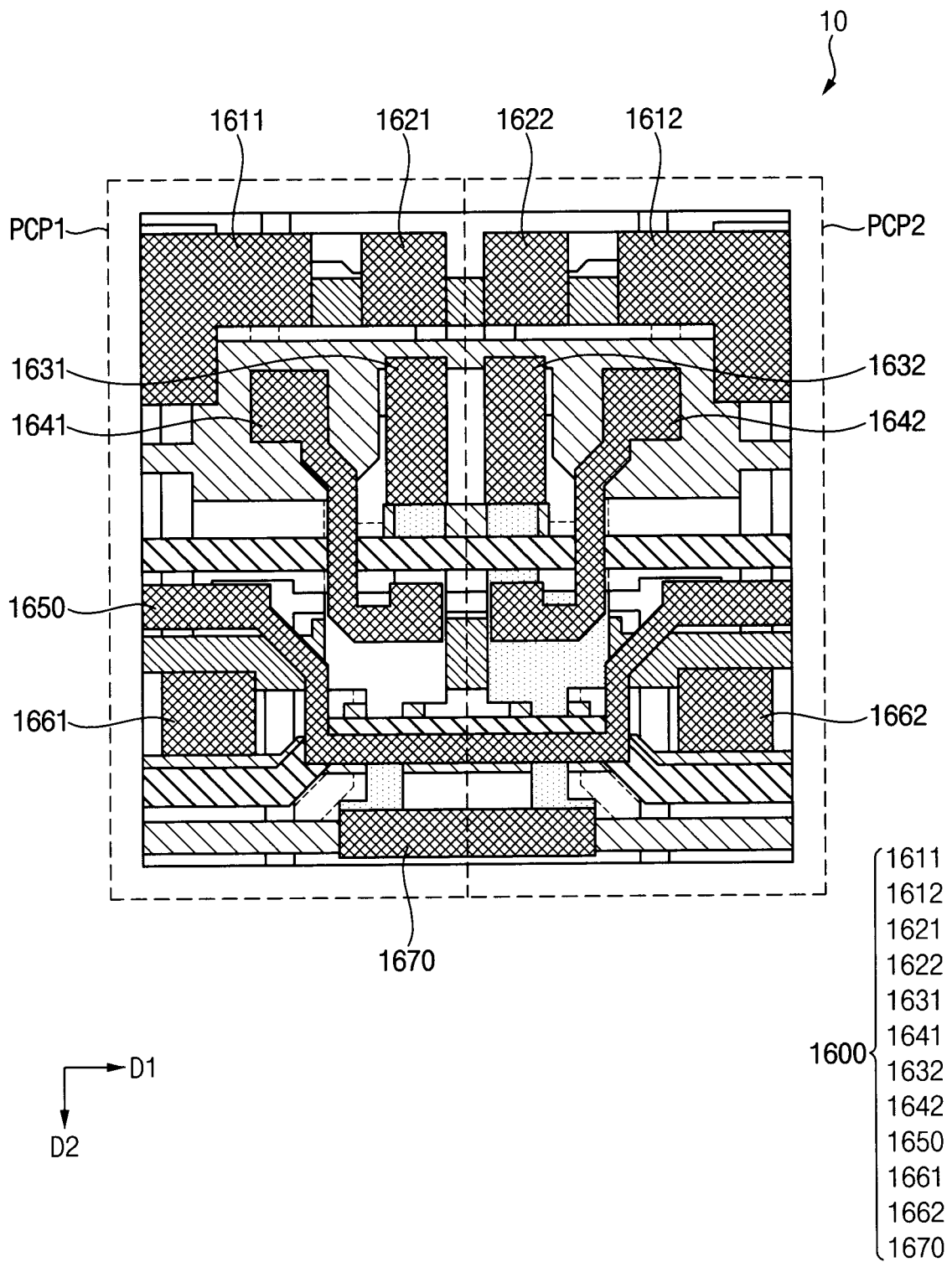

Referring to FIGS. 16 and 19, a third conductive pattern 1500 may be disposed on the third gate insulating layer GI3. The third conductive pattern 1500 may include a second gate line 1510 and a sixth gate line 1520.

The second gate line 1510 may extend in the first direction D1. In some embodiments, the second gate line 1510 may overlap the third gate line 1320 in a plan view and may be electrically connected to the third gate line 1320. In some embodiments, the second gate line 1510 may provide the second gate signal GC to the third transistor T3. For example, the second gate line 1510 may correspond to the gate terminal of the third transistor T3. For example, the second gate line 1510 may be referred to as an upper compensation control line.

The sixth gate line 1520 may extend in the first direction D1. In some embodiments, the sixth gate line 1520 may overlap the fifth gate line 1330 in a plan view and may be electrically connected to the fifth gate line 1330. In some embodiments, the sixth gate line 1520 may provide the third gate signal GI to the fourth transistor T4. For example, the sixth gate line 1520 may correspond to the gate terminal of the fourth transistor T4.

A second interlayer insulating layer ILD2 may cover the third conductive pattern 1500 and may be disposed on the third gate insulating layer GI3. The second interlayer insulating layer ILD2 may include an insulating material.

A fourth conductive pattern 1600 may include a first power voltage pattern 1611, a second power voltage pattern 1612, a first anode pattern 1621, a second anode pattern 1622, a first compensation connection pattern 1631, a second compensation connection pattern 1632, a first initialization connection pattern 1641, a second initialization connection pattern 1642, an anode initialization voltage line 1650, a first data pattern 1661, a second data pattern 1662, and a gate initialization voltage pattern 1670.

The first and second power voltage patterns 1611 and 1612 may transmit the power voltage ELVDD to the first active pattern 1100. In some embodiments, the first and second power voltage patterns 1611 and 1612 may electrically connect a power voltage line (e.g., the power voltage line 1720 of FIG. 18) and the first active pattern 1100. For example, the first and second power voltage patterns 1611 and 1612 may contact the power voltage line 1720 and the first active pattern 1100.

The first anode pattern 1621 may provide the anode initialization voltage AINT or the driving current to the first emitting diode ED1 connected to the first pixel circuit part PCP1. For example, the first anode pattern 1621 may contact the first active pattern 1100 and a third anode pattern (e.g., a third anode pattern 1731 of FIG. 18).

The second anode pattern 1622 may provide the anode initialization voltage AINT or the driving current to the second emitting diode ED2 connected to the second pixel circuit part PCP2. For example, the second anode pattern 1622 may contact the first active pattern 1100 and a fourth anode pattern (e.g., a fourth anode pattern 1732 of FIG. 18).

The first compensation connection pattern 1631 may electrically connect the second terminal of the first transistor T1 included in the first pixel circuit part PCP1 and the second terminal of the third transistor T3 included in the first pixel circuit part PCP1. For example, the first compensation connection pattern 1631 may contact the first active pattern 1100 and the second active pattern 1400.

The second compensation connection pattern 1632 may electrically connect the second terminal of the first transistor T1 included in the second pixel circuit part PCP2 and the second terminal of the third transistor T3 included in the second pixel circuit part PCP2. For example, the second compensation connection pattern 1632 may contact the first active pattern 1100 and the second active pattern 1400.

The first initialization connection pattern 1641 may electrically connect the gate terminal of the first transistor T1 included in the first pixel circuit part PCP1 and the second terminal of the fourth transistor T4 included in the first pixel circuit part PCP1. For example, the first initialization connection pattern 1641 may contact the second active pattern 1400 and the first gate electrode 1221.

The second initialization connection pattern 1642 may electrically connect the gate terminal of the first transistor T1 included in the second pixel circuit part PCP2 and the second terminal of the fourth transistor T4 included in the second pixel circuit part PCP2. For example, the second initialization connection pattern 1642 may contact the second active pattern 1400 and the second gate electrode 1222.

The anode initialization voltage line 1650 may provide the anode initialization voltage AINT to the seventh transistor T7. For example, the anode initialization voltage line 1650 may contact the first active pattern 1100.

The first data pattern 1661 may provide the data voltage DATA to the second transistor T2 included in the first pixel circuit part PCP1. For example, the first data pattern 1661 may contact the first active pattern 1100 and a first data line (e.g., a first data line 1711 of FIG. 18).

The second data pattern 1662 may provide the data voltage DATA to the second transistor T2 included in the second pixel circuit part PCP2. For example, the second data pattern 1662 may contact the first active pattern 1100 and a second data line (e.g., a second data line 1712 of FIG. 18).

The gate initialization voltage pattern 1670 may provide the gate initialization voltage VINT to the fourth transistor T4. For example, the gate initialization voltage pattern 1670 may provide the gate initialization voltage VINT to the second active pattern 1400. The gate initialization voltage pattern 1670 may contact the gate initialization voltage line 1340 and the second active pattern 1400.

A first via insulating layer VIA1 may cover the fourth conductive pattern 1600 and may be disposed on the second interlayer insulating layer ILD2. The first via insulating layer VIA1 may include an organic insulating material. For example, the first via insulating layer VIA1 may include a photoresist, a polyacrylic resin, a polyimide resin, an acrylic resin, and/or the one or more other suitable materials.

Figure 18:
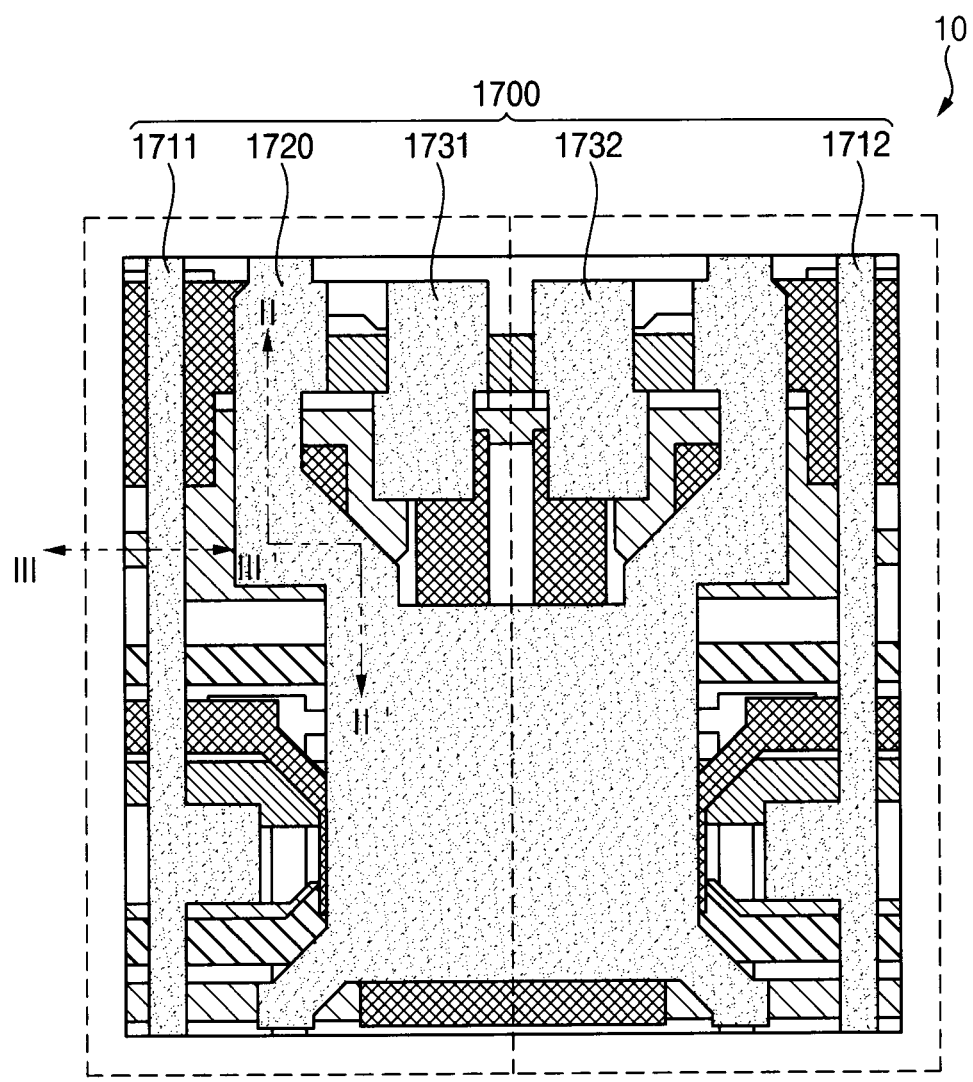
Figure 19:
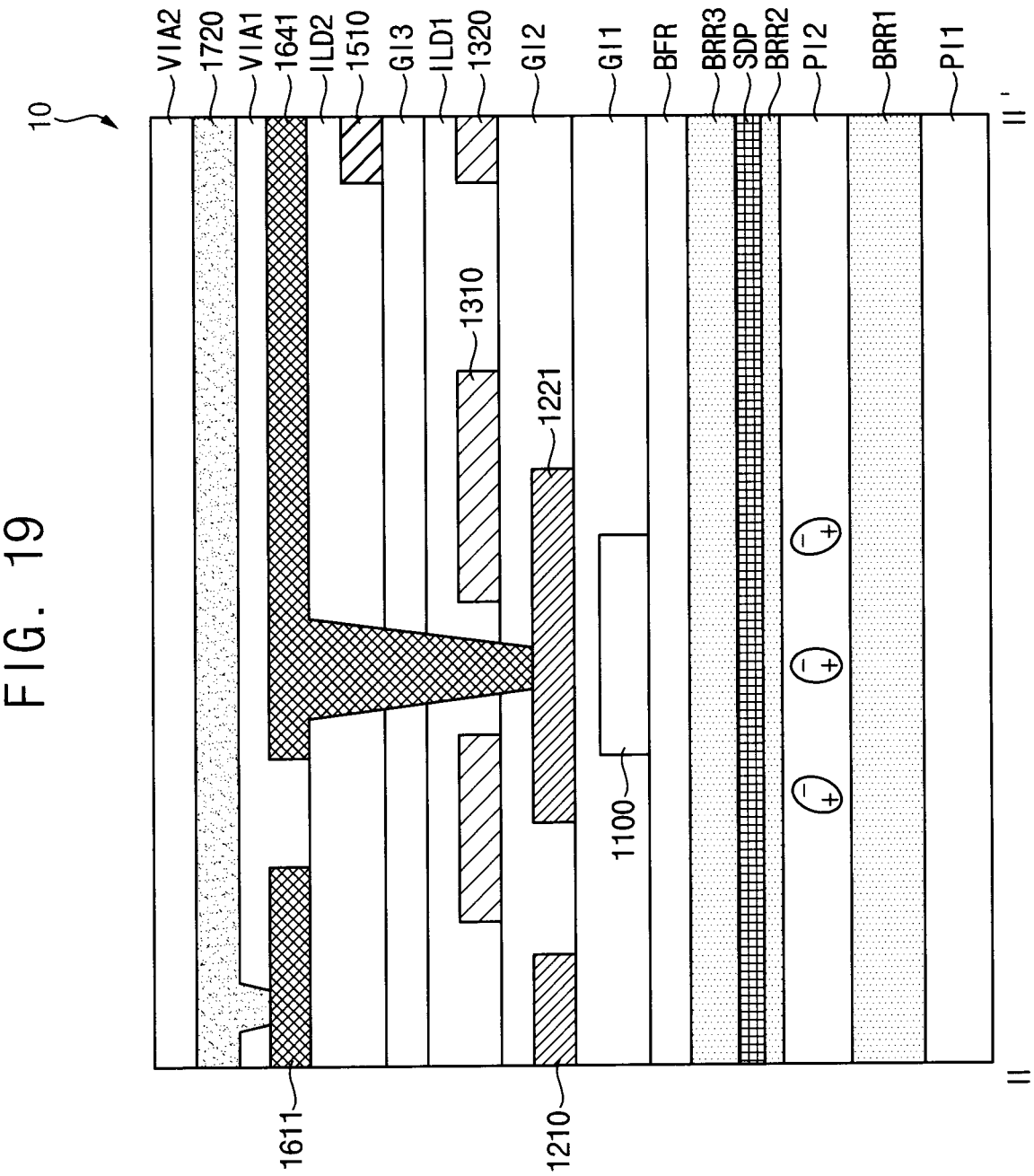
FIG. 19 is a cross-sectional view illustrating an example taken along line II-II' of FIG. 18.
Figure 20:
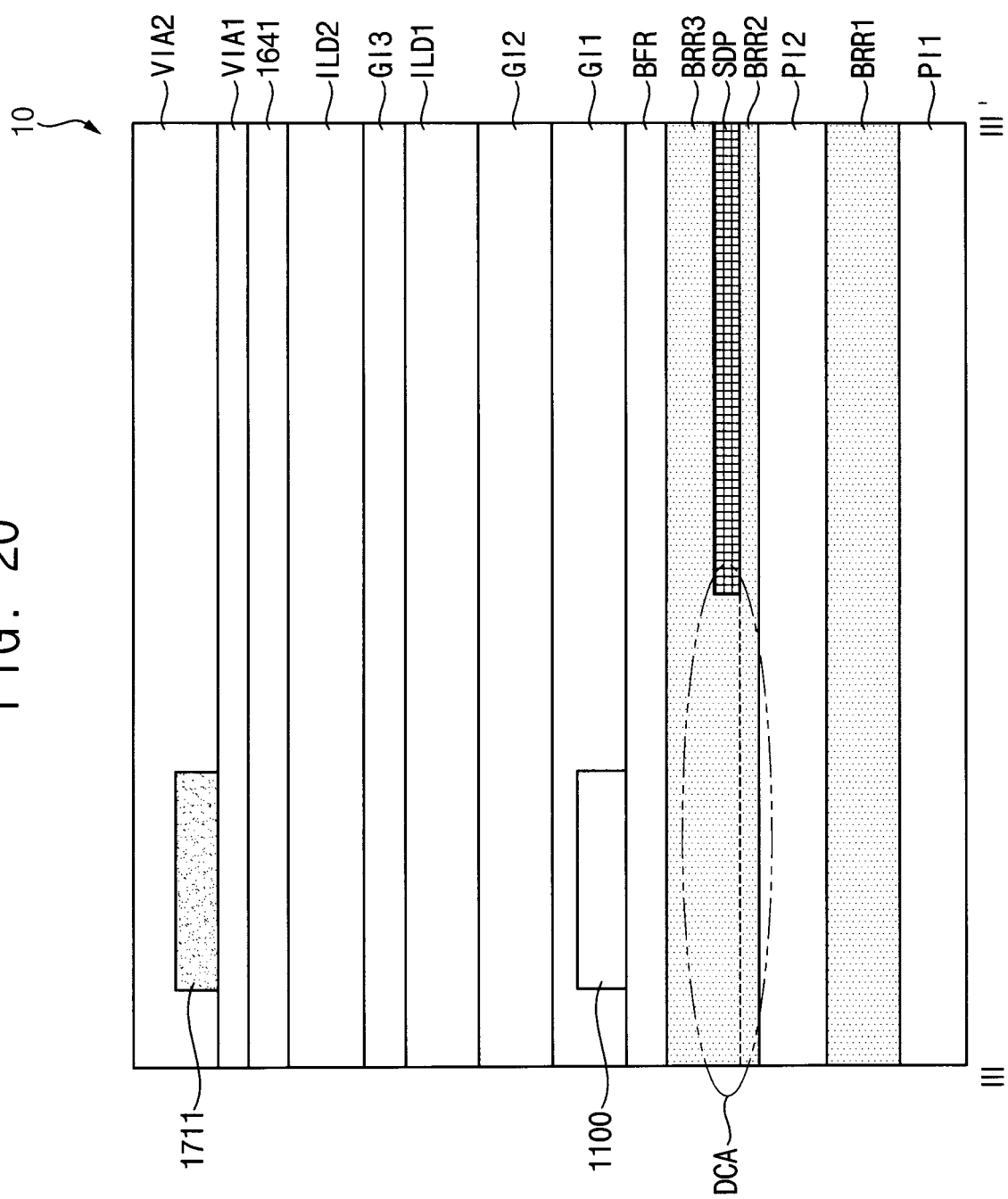
FIG. 20 is a cross-sectional view illustrating an example taken along line III-III' of FIG. 18.

Referring to FIGS. 18 and 19, a fifth conductive pattern 1700 may be disposed on the first via insulating layer VIA1. The fifth conductive pattern 1700 may include the first data line 1711, the second data line 1712, the power voltage line 1720, the third anode pattern 1731, and the fourth anode pattern 1732.

The first data line 1711 may extend in the second direction D2. In some embodiments, the first data line 1711 may provide the data voltage DATA to the second transistor T2 included in the first pixel circuit part PCP1. For example, the first data line 1711 may contact the first data pattern 1661.

The second data line 1712 may extend in the second direction D2. In some embodiments, the second data line 1712 may provide the data voltage DATA to the second transistor T2 included in the second pixel circuit part PCP2. For example, the second data line 1712 may contact the second data pattern 1662.

The power voltage line 1720 may extend in the second direction D2. In some embodiments, the power voltage line 1720 may provide the power voltage ELVDD to the first and second power voltage patterns 1611 and 1612. For example, the power voltage line 1720 may contact the first and second power voltage patterns 1611 and 1612.

The third anode pattern 1731 may provide the anode initialization voltage AINT or the driving current to the first emitting diode ED1 connected to the first pixel circuit part PCP1. For example, the third anode pattern 1731 may contact the first anode pattern 1621.

The fourth anode pattern 1732 may provide the anode initialization voltage AINT or the driving current to the second emitting diode ED2 connected to the second pixel circuit part PCP2. For example, the fourth anode pattern 1732 may contact the second anode pattern 1622.

A second via insulating layer VIA2 may cover the fifth conductive pattern 1700 and may be disposed on the first via insulating layer VIA1. The second via insulating layer VIA2 may include an organic insulating material. For example, the second via insulating layer VIA2 may include a photoresist, a polyacrylic resin, a polyimide resin, an acrylic resin, and/or one or more other suitable materials.

As shown in FIG. 19, the lower pattern SDP may overlap the first active pattern 1100, the first gate electrode 1221, and the power voltage line 1720 (e.g., in a thickness direction or in a plan view). In a plan view, the first gate line 1210 may be adjacent (e.g., closer) to the first side (e.g., the left side) of the first gate electrode 1221, and the fourth gate line 1320 and the second gate line 1510 may be adjacent to the second side (e.g., the right side) of the first gate electrode 1221.

As described above, the emission control signal EM may be provided to the first gate line 1210, and the second gate signal GC may be provided to the fourth gate line 1320 and the second gate line 1510. In order to turn on the fifth and sixth transistors T5 and T6, the emission control signal EM may have a negative voltage level. At the same time, in order to turn off the third transistor T3, the second gate signal GC may have a negative voltage level.

In a related art display device, when the emission control signal EM and the second gate signal GC have the same negative voltage level at the same time, an electric field may be formed in the second organic film layer PI2. Accordingly, organic materials in the second organic film layer PI2 may be polarized. A back channel may be formed in the first active pattern 1100 by the polarized organic materials. Accordingly, electrical characteristics (e.g., threshold voltage, electron mobility, etc.) of the first transistor T1 may be changed. Accordingly, the pixel including the first transistor T1 whose electrical characteristics have been changed may emit luminance not corresponding to the data voltage DATA, and display quality of the display device may be deteriorated.

However, the display device 10 may include the lower pattern SDP disposed between the second organic film layer PI2 and the first active pattern 1100. The lower pattern SDP may shield the first active pattern 1100 from the polarized organic materials. Accordingly, the back channel may not be formed in the first active pattern 1100 and electrical characteristics of the first transistor T1 may not be changed. Accordingly, display quality of the display device 10 may be improved.

The lower pattern SDP may have a mesh shape. For example, the lower pattern SDP may be connected to each other, and may be repeatedly arranged in a certain unit. As the lower pattern SDP has the mesh shape, the lower pattern SDP can effectively suppress the polarization of the organic materials.

Figure 8:
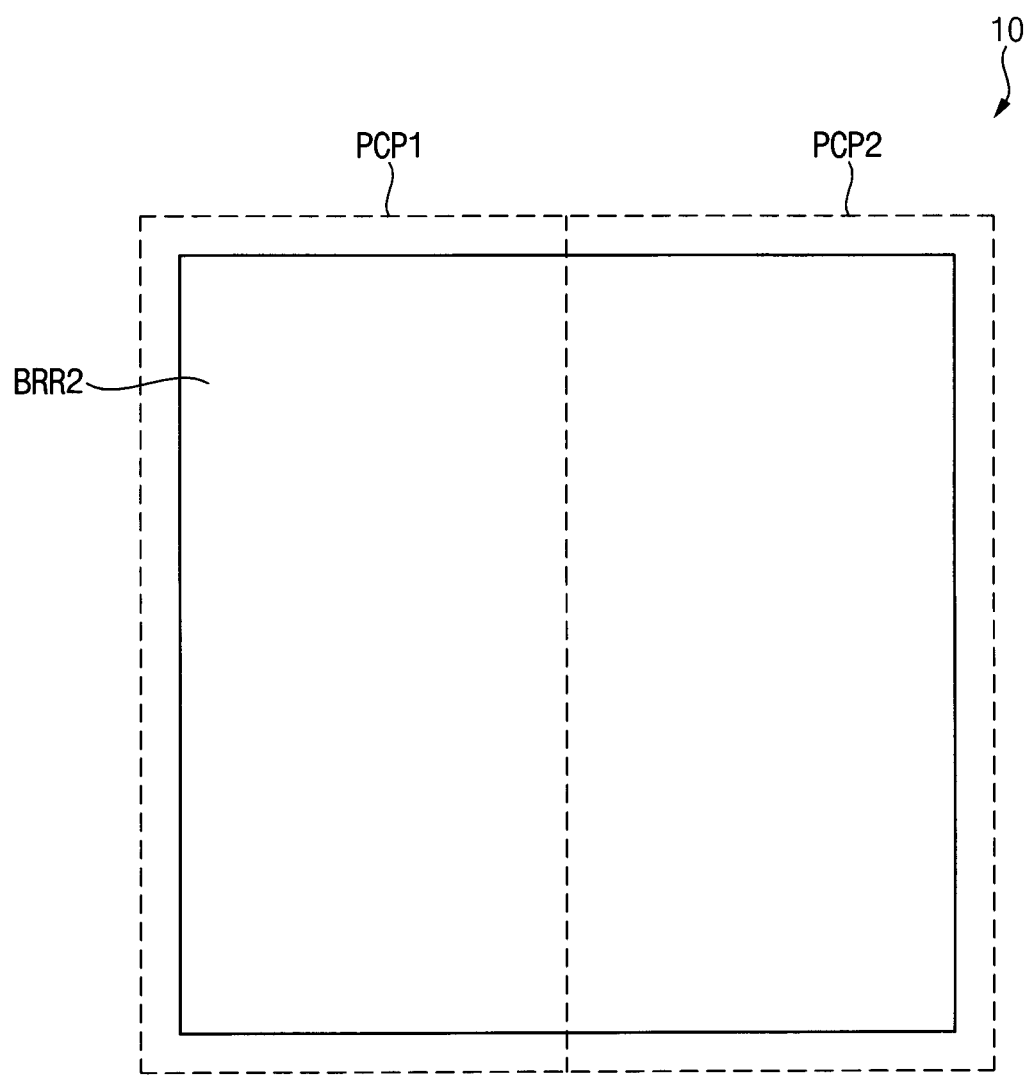
Figure 9:
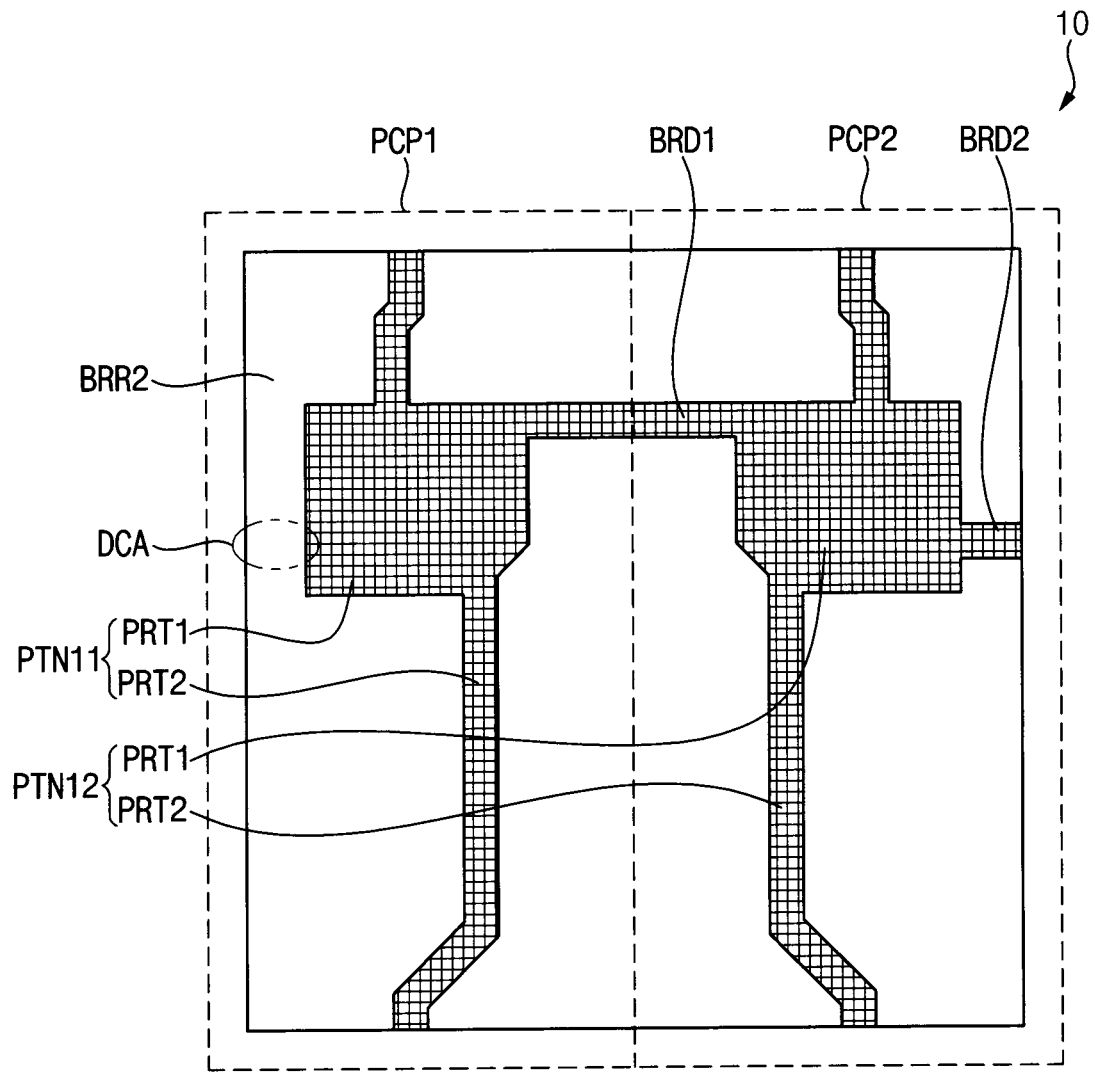

In addition, as shown in FIGS. 8, 18, and 20, the lower pattern SDP may have a mesh shape defining the disconnection area DCA. The lower pattern SDP may not be formed in the disconnection area DCA. Accordingly, the lower pattern SDP may include the first pattern PTN1 and the second pattern PTN2 that are not connected to each other. In other words, the second barrier layer BRR2 and the third barrier layer BRR3 may contact each other in the disconnection area DCA.

As the lower pattern SDP is removed from the disconnection area DCA, a unit area of the lower pattern SDP may be reduced. Accordingly, resistance of the lower pattern SDP may be increased, and a crosstalk between the lower pattern SDP and the first data line 1711 (or the second data line 1712) may be improved (e.g., reduced). In other words, even if the data voltage DATA transmitted to the first data line 1711 is fluctuated, the potential of the lower pattern SDP may fluctuate relatively little. Accordingly, a crosstalk between the lower pattern SDP and the first gate electrode 1221 (or the second gate electrode 1222) may be improved (e.g., reduced). In other words, since the potential of the lower pattern SDP fluctuates relatively little, an electrical influence of the potential of the lower pattern SDP on the first gate electrode 1221 may be reduced.

Meanwhile, the polarization of the organic materials may be further accelerated by the light incident on the display panel 100 described with reference to FIG. 4 (e.g., 11 or 12 of FIG. 4). Accordingly, in some embodiments, the lower pattern SDP may overlap with the fingerprint recognition area FA and may not overlap with the display area DA. In other words, the lower pattern SDP may be formed in the display panel 100 overlapping the fingerprint recognition area FA, and may not be formed in the display panel 100 overlapping the display area DA.

Figure 21:
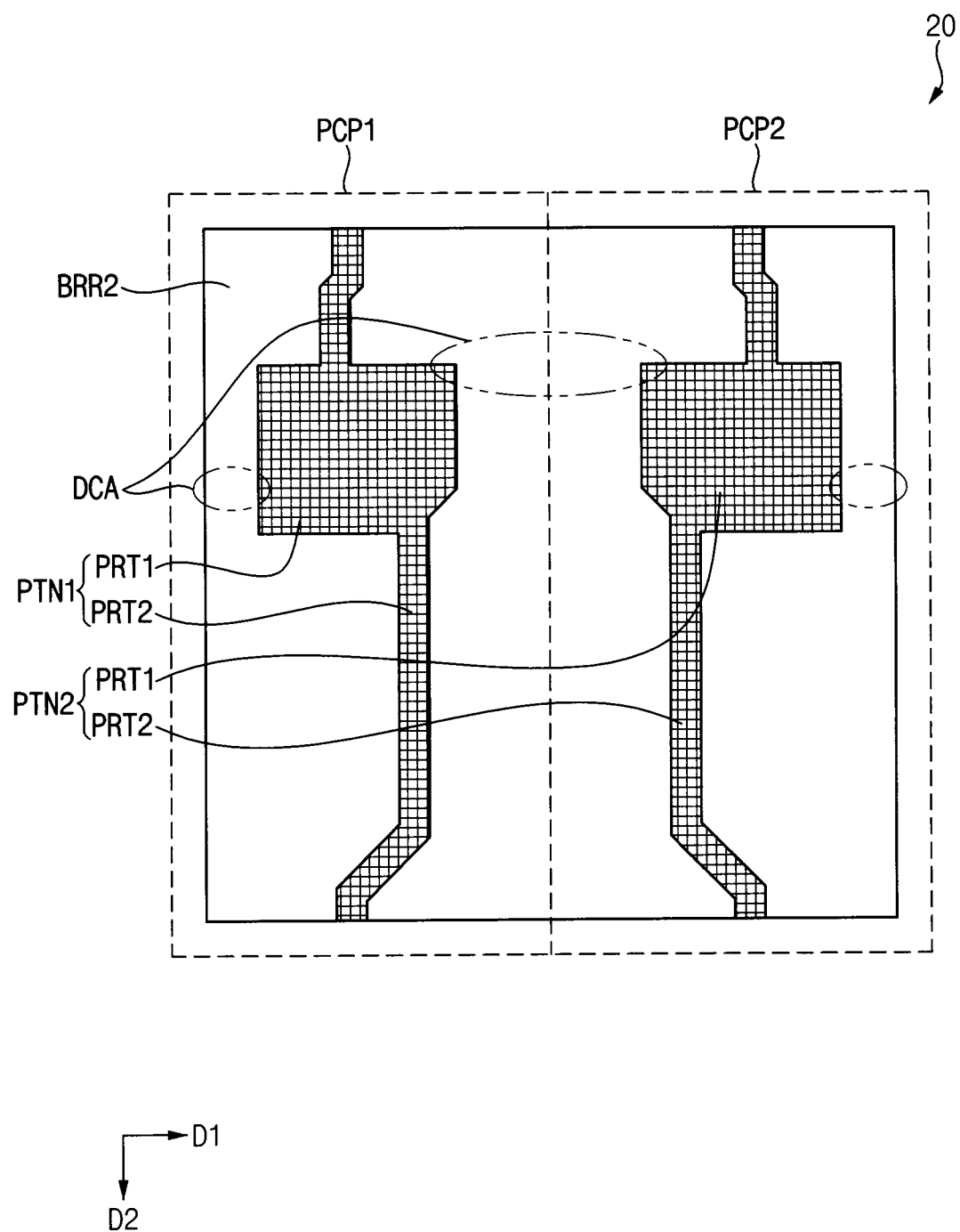
FIG. 21-FIG. 25 are layout diagrams illustrating a display device according to another embodiment.
Figure 22:
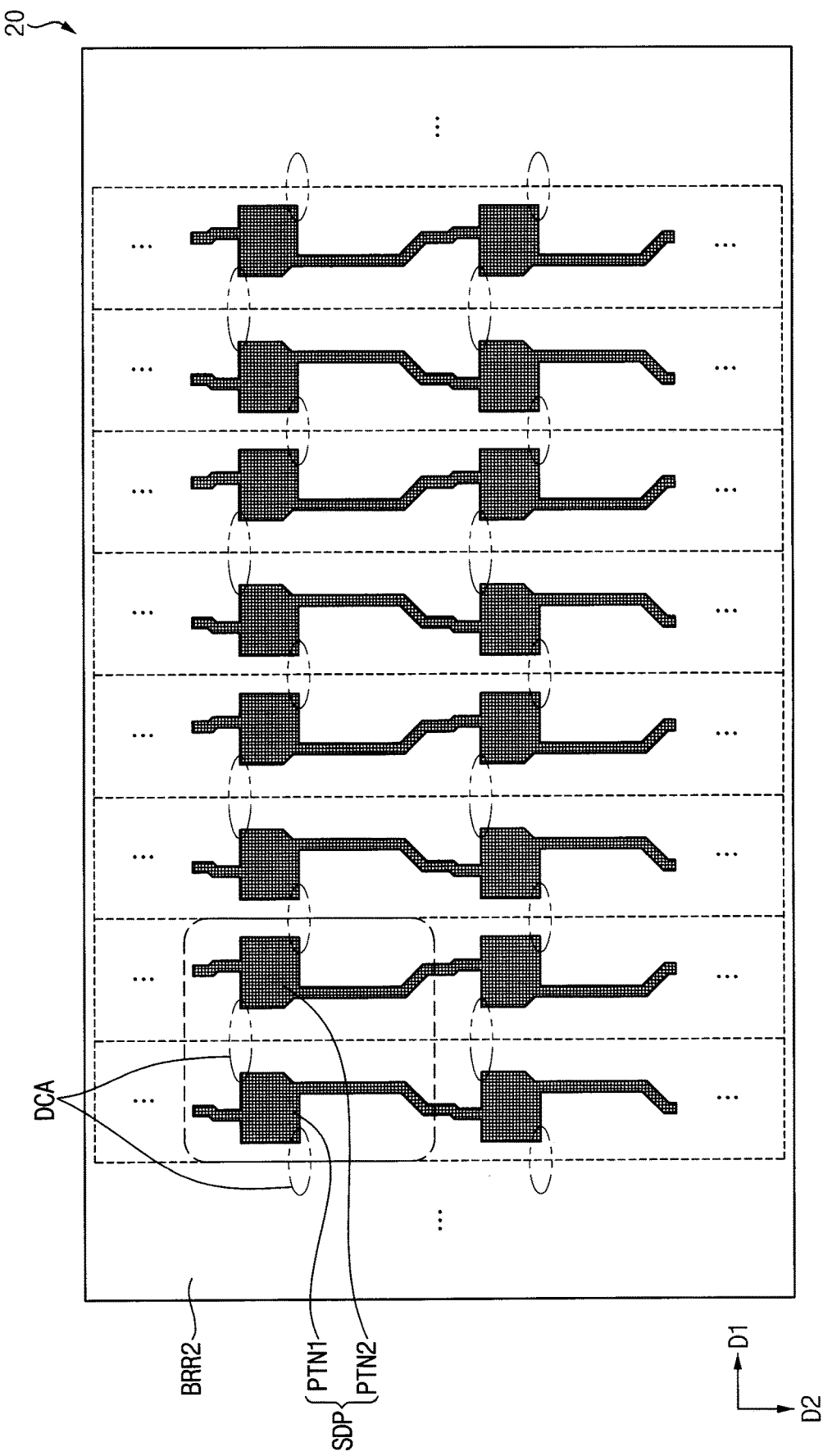
Figure 23:
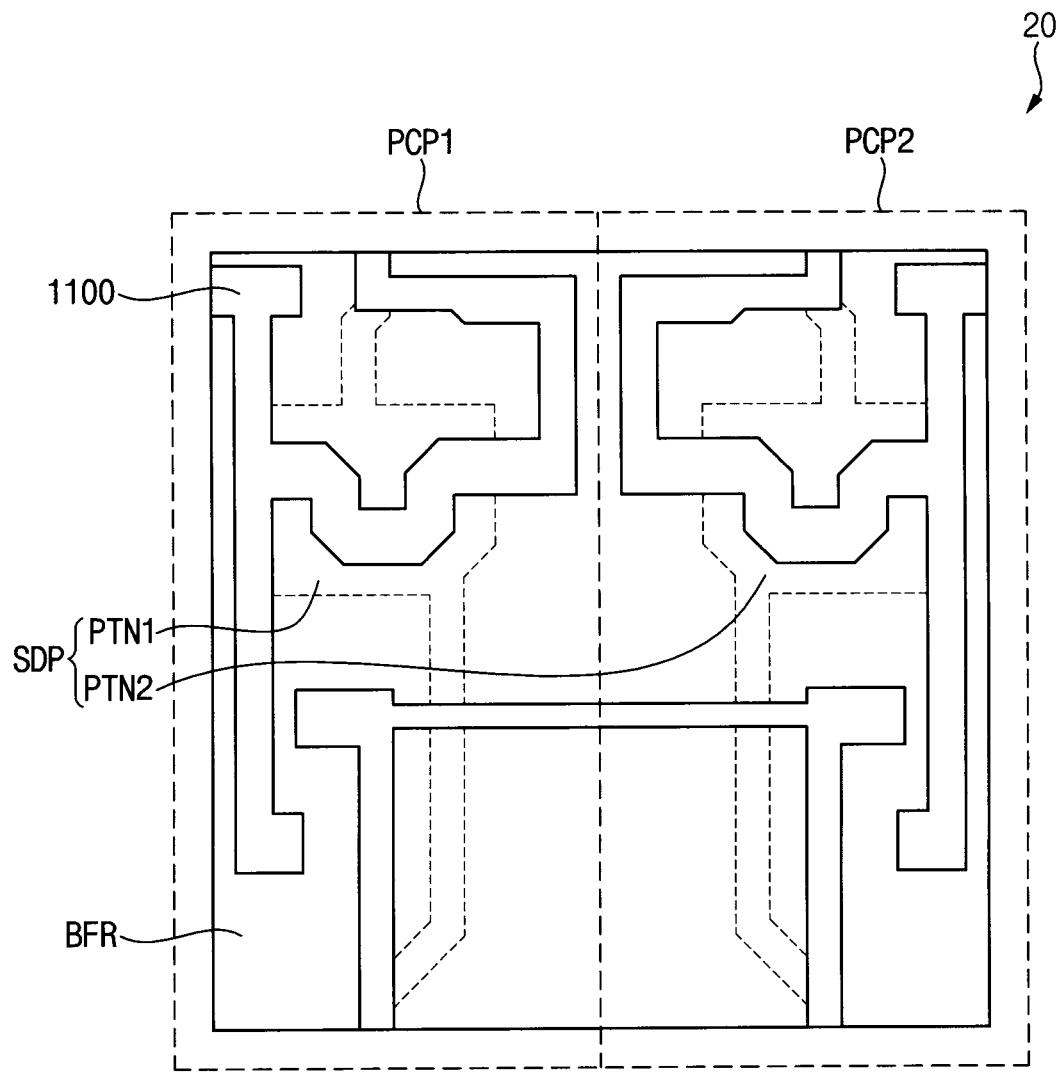
Figure 24:
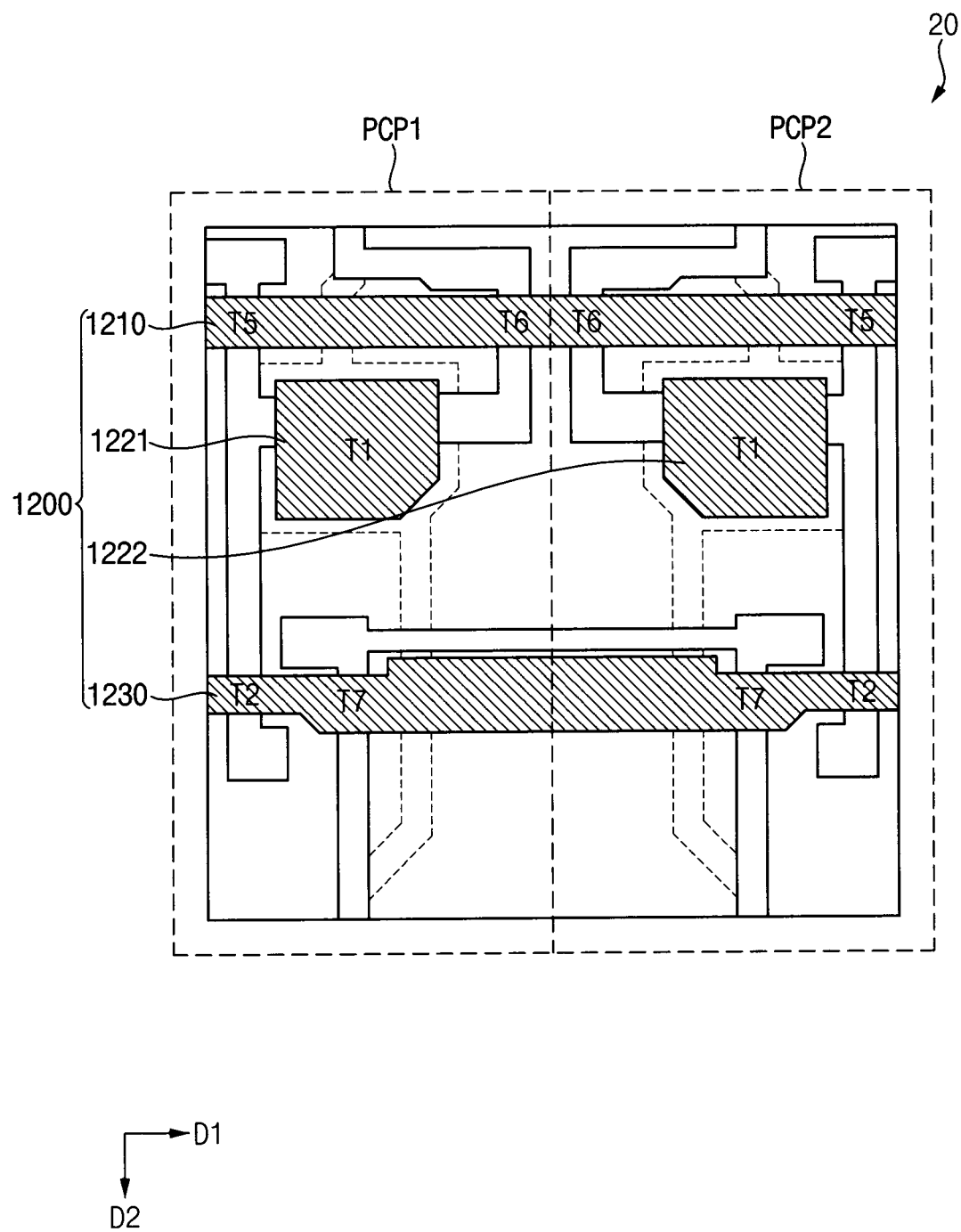
Figure 25:
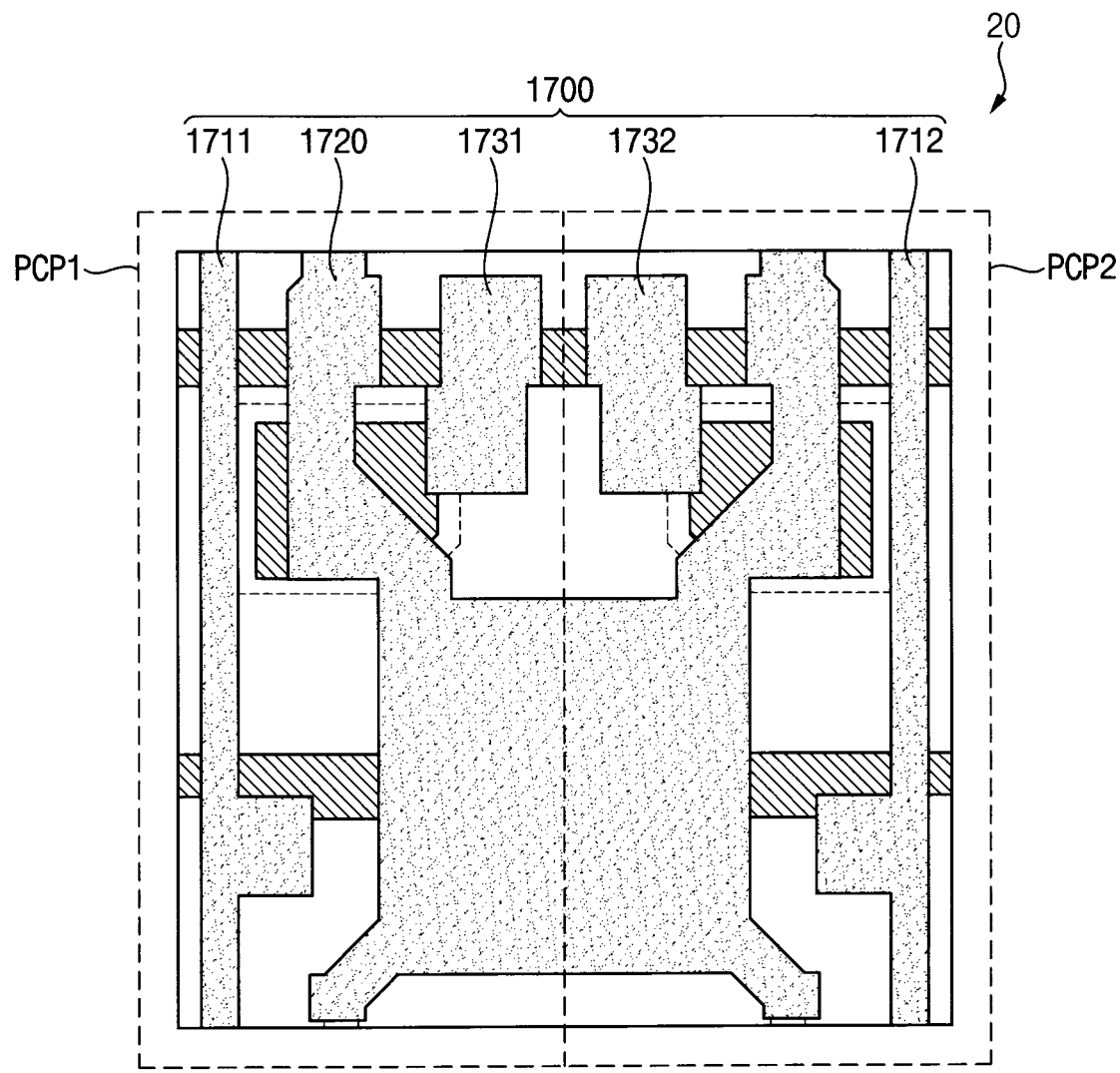

FIG. 21 to FIG. 25 are layout diagrams illustrating a display device according to another embodiment. For example, FIGS. 21 and 22 are layout diagrams illustrating a lower pattern, FIG. 23 is a layout diagram illustrating the lower pattern and a first active pattern, FIG. 24 is a layout diagram illustrating the lower pattern, the first active pattern, and a first conductive pattern, and FIG. 25 is a layout diagram illustrating the lower pattern, the first active pattern, the first conductive pattern, and a fifth conductive pattern.

Referring to FIGS. 21 to 25, a display device 20 according to another embodiment may include a first pixel circuit part PCP1 and a second pixel circuit part PCP2 adjacent to the first pixel circuit part PCP1. In some embodiments, the second pixel circuit part PCP2 may have a shape symmetrical with a shape of the first pixel circuit part PCP1.

However, the display device 20 may be substantially the same as the display device 10 except for the shape of the lower pattern SDP. For example, the display device 20 may include the first organic film layer PI1, the first barrier layer BRR1, the second organic film layer PI2, the second barrier layer BRR2, the third barrier layer BRR3, the buffer layer BFR, the first active pattern 1100, the first gate insulating layer GI1, the first conductive pattern 1200, the second gate insulating layer GI2, the second conductive pattern 1300, the first interlayer insulating layer ILD1, the second active pattern 1400, the third gate insulating layer GI3, the third conductive pattern 1500, the second interlayer insulating layer ILD2, the fourth conductive pattern 1600, the first via insulating layer VIA1, the fifth conductive pattern 1700, and the second via insulating layer VIA2. Hereinafter, the shape of the lower pattern SDP will be mainly described.

As shown in FIGS. 21 and 22, the lower pattern SDP included in the display device 20 may be disposed on the second barrier layer BRR2. In some embodiments, the lower pattern SDP may have a mesh shape defining a disconnection area DCA.

In some embodiments, the lower pattern SDP may include a first pattern PTN1 and a second pattern PTN2. The first pattern PTN1 may extend in the second direction D2. The second pattern PTN2 may extend in the second direction D2 and may be spaced apart from the first pattern PTN1 in the first direction D1. For example, a second shape of the second pattern PTN2 may be symmetrical with a first shape of the first pattern PTN1 in the first direction D1.

In some embodiments, the first pattern PTN1 and the second pattern PTN2 may not be connected to each other. In other words, the first pattern PTN1 and the second pattern PTN2 may be disconnected from each other. For example, the disconnection area DCA may be positioned between the first pattern PTN1 and the second pattern PTN2.

In more detail, the disconnection area DCA may be an area in which the first pattern PTN1 and the second pattern PTN2 are disconnected from each other. In other words, the lower pattern SDP may be partially removed from the disconnection area DCA. Accordingly, the second barrier layer BRR2 may contact the third barrier layer BRR3 in the disconnection area DCA.

The first pattern PTN1 may include a first portion PRT1 overlapping the first gate electrode 1221 and a second portion PRT2 extending in the second direction D2. The second pattern PTN2 may include a first portion PRT1 overlapping the second gate electrode 1222 and a second portion PRT2 extending in the second direction D2. The second shape of the second pattern PTN2 may be symmetrical with the first shape of the first pattern PTN1 in the first direction D1.

As shown in FIGS. 21 and 24, the first portion PRT1 of the first pattern PTN1 may completely overlap the first gate electrode 1221. For example, a shape of the first portion PRT1 of the first pattern PTN1 may be substantially the same as a shape of the first gate electrode 1221, and a size of the first portion PRT1 of the first pattern PTN1 may be greater than or equal to a size of the first gate electrode 1221.

As shown in FIGS. 21 and 25, the second portion PRT2 of the first pattern PTN1 may overlap the power voltage line 1720. For example, the second portion PRT2 of the first pattern PTN1 may be disposed along the power voltage line 1720.

As shown in FIGS. 21 and 24, the first portion PRT1 of the second pattern PTN2 may completely overlap the second gate electrode 1222. For example, a shape of the first portion PRT1 of the second pattern PTN2 may be substantially the same as a shape of the second gate electrode 1222, and a size of the first portion PRT1 of the second pattern PTN2 may be greater than or equal to a size of the second gate electrode 1222.

As shown in FIGS. 21 and 25, the second portion PRT2 of the second pattern PTN2 may overlap the power voltage line 1720. For example, the second portion PRT2 of the second pattern PTN2 may be disposed along the power voltage line 1720.

The first pattern PTN1 and the second pattern PTN2 may be disconnected from each other. In other words, the lower pattern SDP may not include the first and second bridges BRD1 and BRD2 described with reference to FIG. 9. Accordingly, the unit area of the lower pattern SDP may be reduced.

Figure 26:
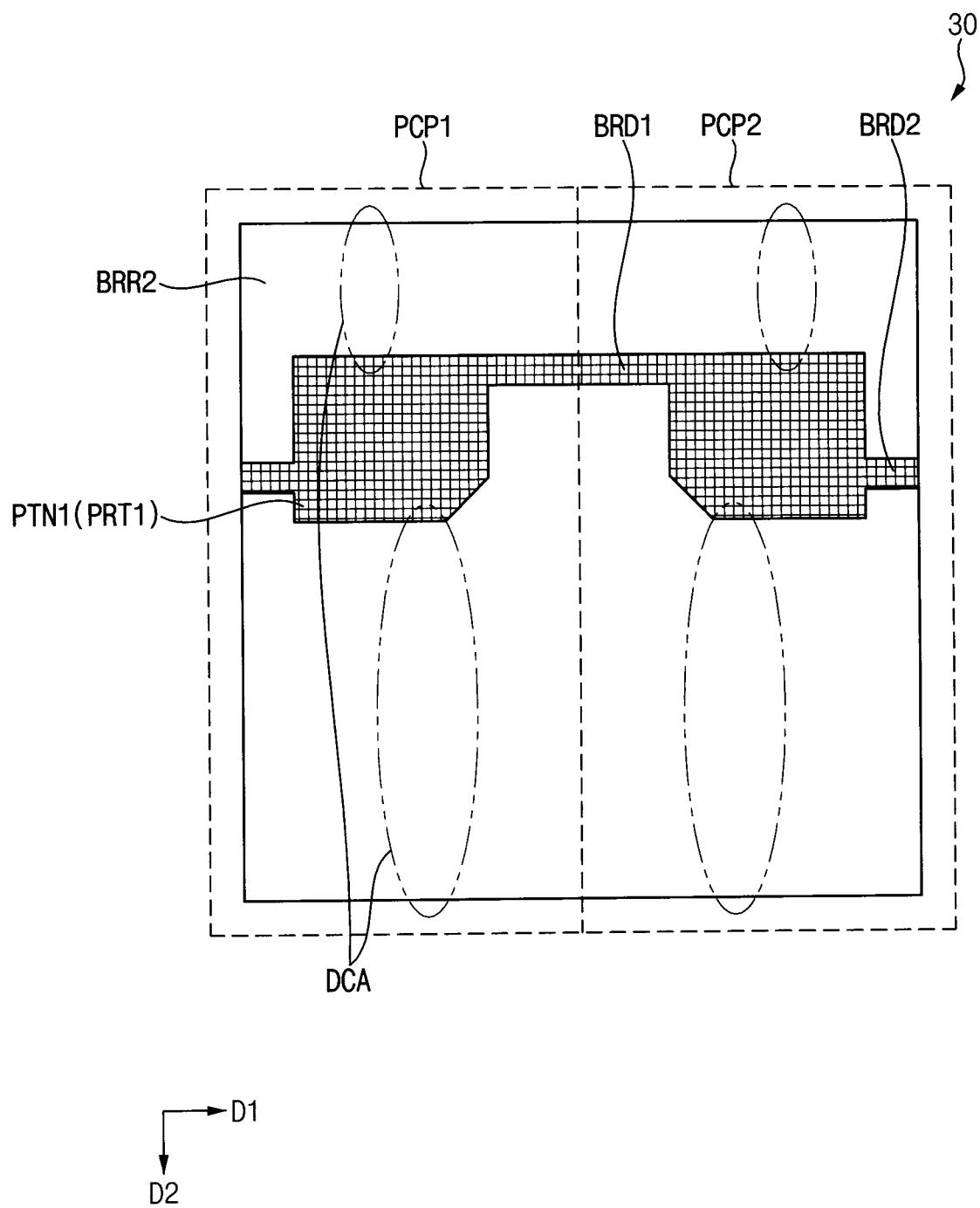
FIG. 26-FIG. 30 are layout diagrams illustrating a display device according to still another embodiment.
Figure 27:
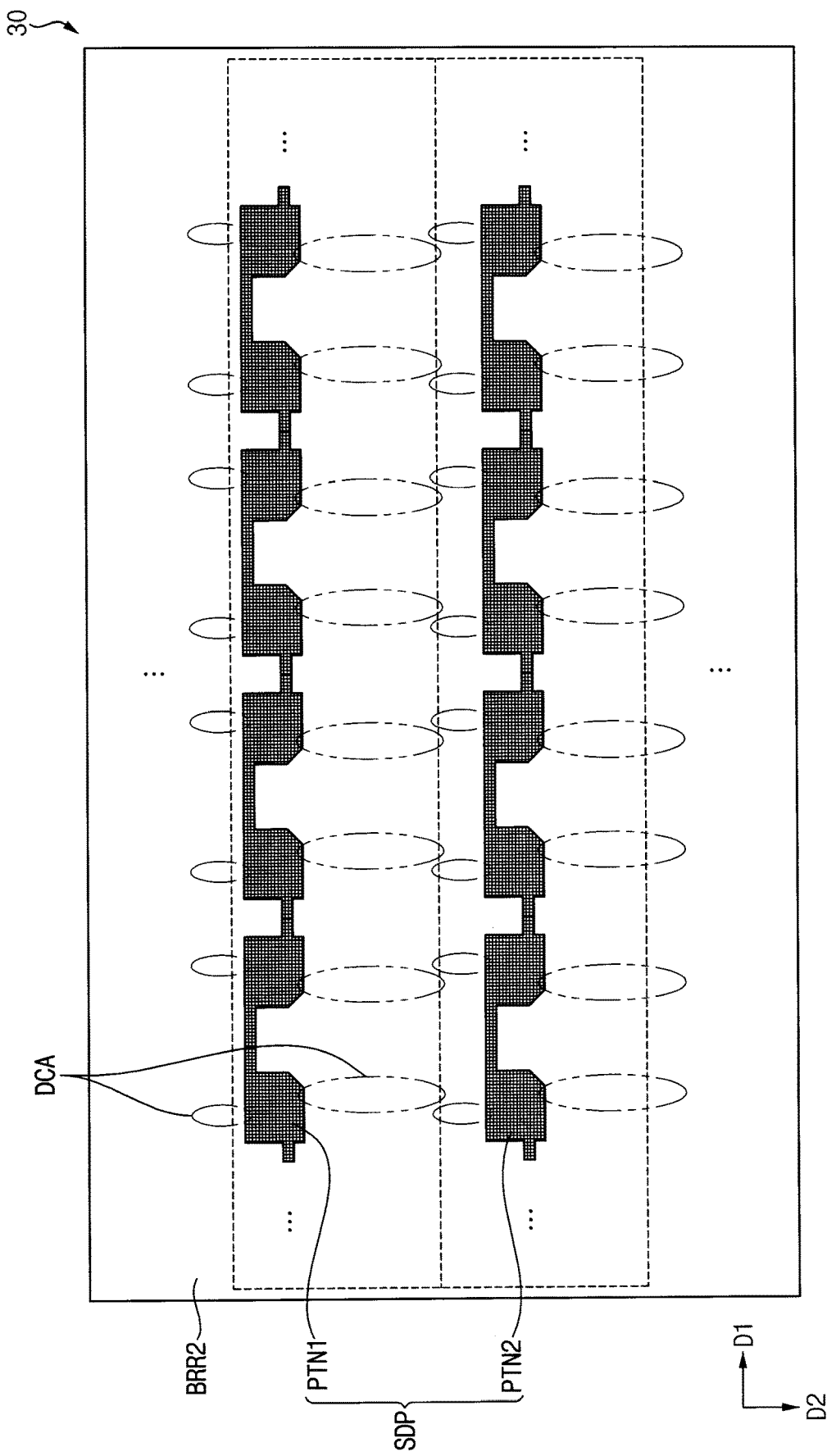
Figure 28:
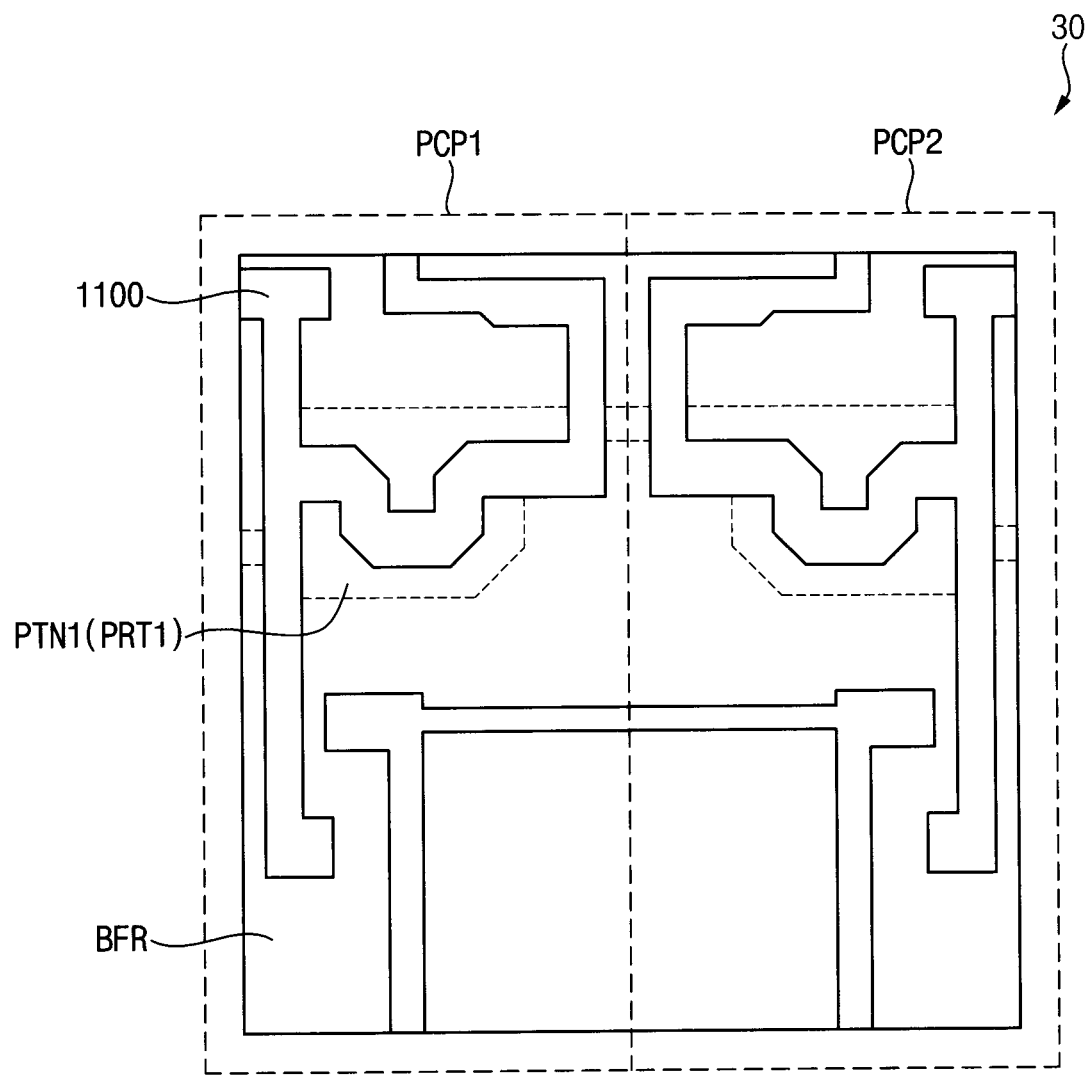
Figure 29:
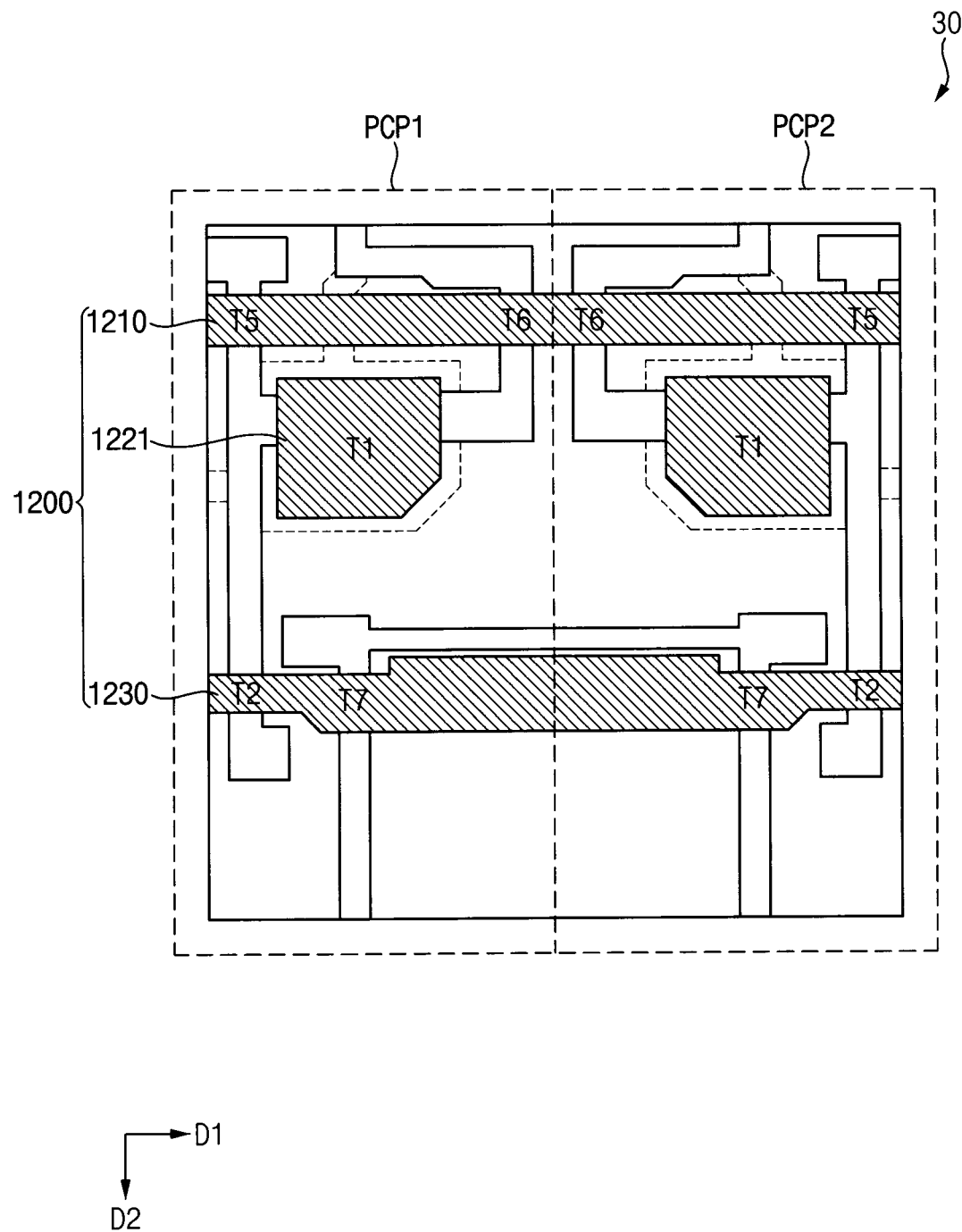
Figure 30:
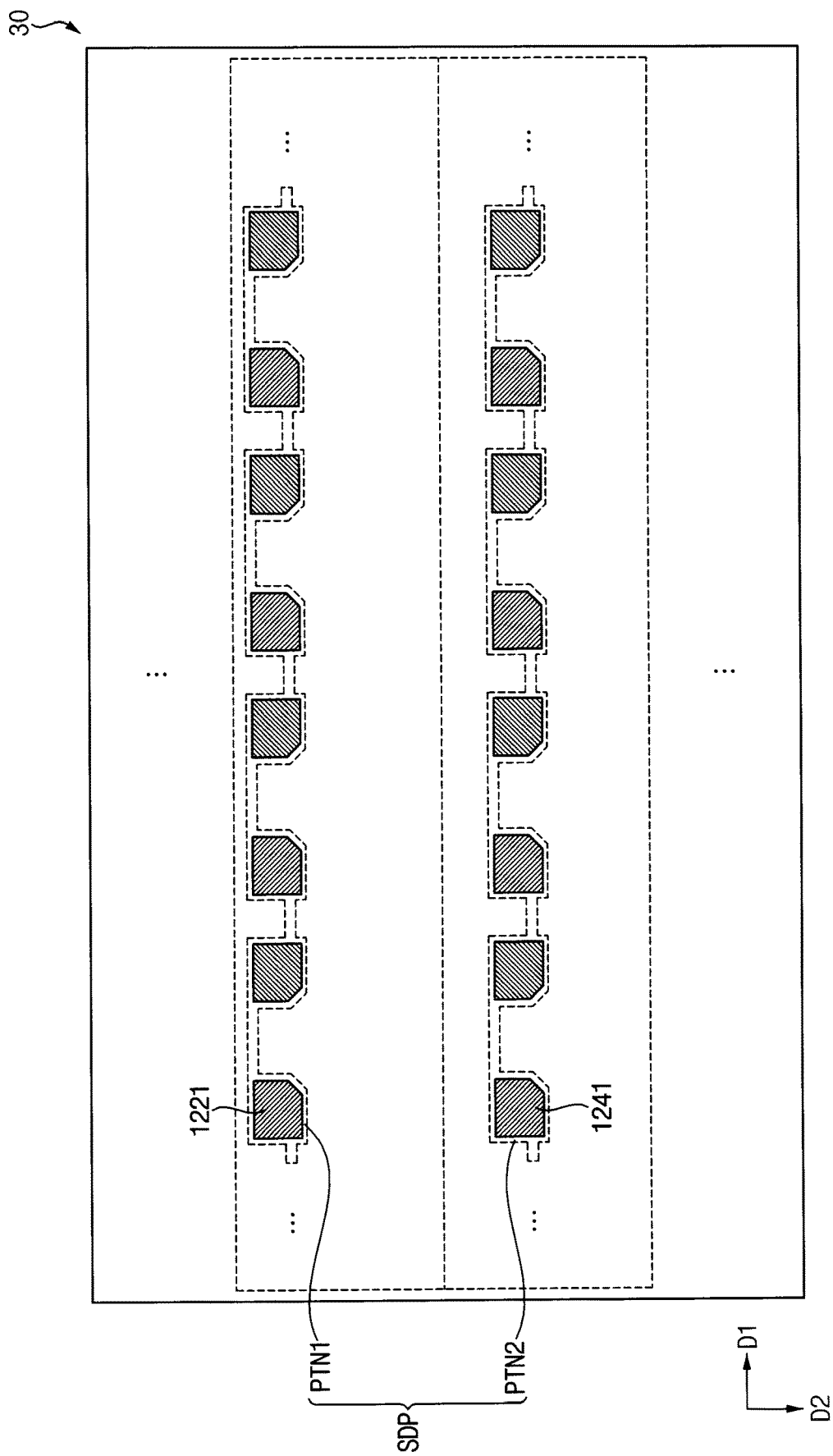

FIG. 26 to FIG. 30 are layout diagrams illustrating a display device according to still another embodiment. For example, FIGS. 26 and 27 are layout diagrams illustrating a lower pattern, FIG. 28 is a layout diagram illustrating the lower pattern and a first active pattern, FIG. 29 is a layout diagram illustrating the lower pattern, the first active pattern, and a first conductive pattern, and FIG. 30 is a layout diagram illustrating the lower pattern and a gate electrode.

Referring to FIGS. 26 to 30, a display device 30 according to another embodiment may include a first pixel circuit part PCP1 and a second pixel circuit part PCP2 adjacent to the first pixel circuit part PCP1. In some embodiments, the second pixel circuit part PCP2 may have a shape symmetrical to a shape of the first pixel circuit part PCP1.

However, the display device 30 may be substantially the same as the display device 10 except for the shape of the lower pattern SDP. For example, the display device 30 may include the first organic film layer PI1, the first barrier layer BRR1, the second organic film layer PI2, the second barrier layer BRR2, the third barrier layer BRR3, the buffer layer BFR, the first active pattern 1100, the first gate insulating layer GI1, the first conductive pattern 1200, the second gate insulating layer GI2, the second conductive pattern 1300, the first interlayer insulating layer ILD1, the second active pattern 1400, the third gate insulating layer GI3, the third conductive pattern 1500, the second interlayer insulating layer ILD2, the fourth conductive pattern 1600, the first via insulating layer VIA1, the fifth conductive pattern 1700, and the second via insulating layer VIA2. Hereinafter, the shape of the lower pattern SDP will be mainly described.

As shown in FIGS. 26 and 27, the lower pattern SDP included in the display device 30 may be disposed on the second barrier layer BRR2. In some embodiments, the lower pattern SDP may have a mesh shape defining a disconnection area DCA.

In some embodiments, the lower pattern SDP may include a first pattern PTN1 and a second pattern PTN2. The first pattern PTN1 may extend in the first direction D1. The second pattern PTN2 may extend in the first direction D1 and may be spaced apart from the first pattern PTN1 in the second direction D2. For example, a shape of the first pattern PTN1 and a shape of the second pattern PTN2 may be the same.

In some embodiments, the first pattern PTN1 and the second pattern PTN2 may not be connected to each other. In other words, the first pattern PTN1 and the second pattern PTN2 may be disconnected from each other. For example, the disconnection area DCA may be positioned between the first pattern PTN1 and the second pattern PTN2. In other words, the lower pattern SDP may not include the second part PRT2 described with reference to FIG. 9.

In more detail, the disconnection area DCA may be an area in which the first pattern PTN1 and the second pattern PTN2 are disconnected from each other. In other words, the lower pattern SDP may be partially removed from the disconnection area DCA. Accordingly, the second barrier layer BRR2 may contact the third barrier layer BRR3 in the disconnection area DCA.

In some embodiments, as shown in FIG. 30, the display device 30 may include a first gate electrode 1221 and a second gate electrode 1241 arranged in the second direction D2. The first pattern PTN1 may overlap the first gate electrode 1221, and the second pattern PTN2 may overlap the second gate electrode 1241.

The first pattern PTN1 and the second pattern PTN2 may be disconnected from each other. In other words, the lower pattern SDP may not include the second portion PRT2 described with reference to FIG. 9. Accordingly, the unit area of the lower pattern SDP may be reduced.

Figure 31:
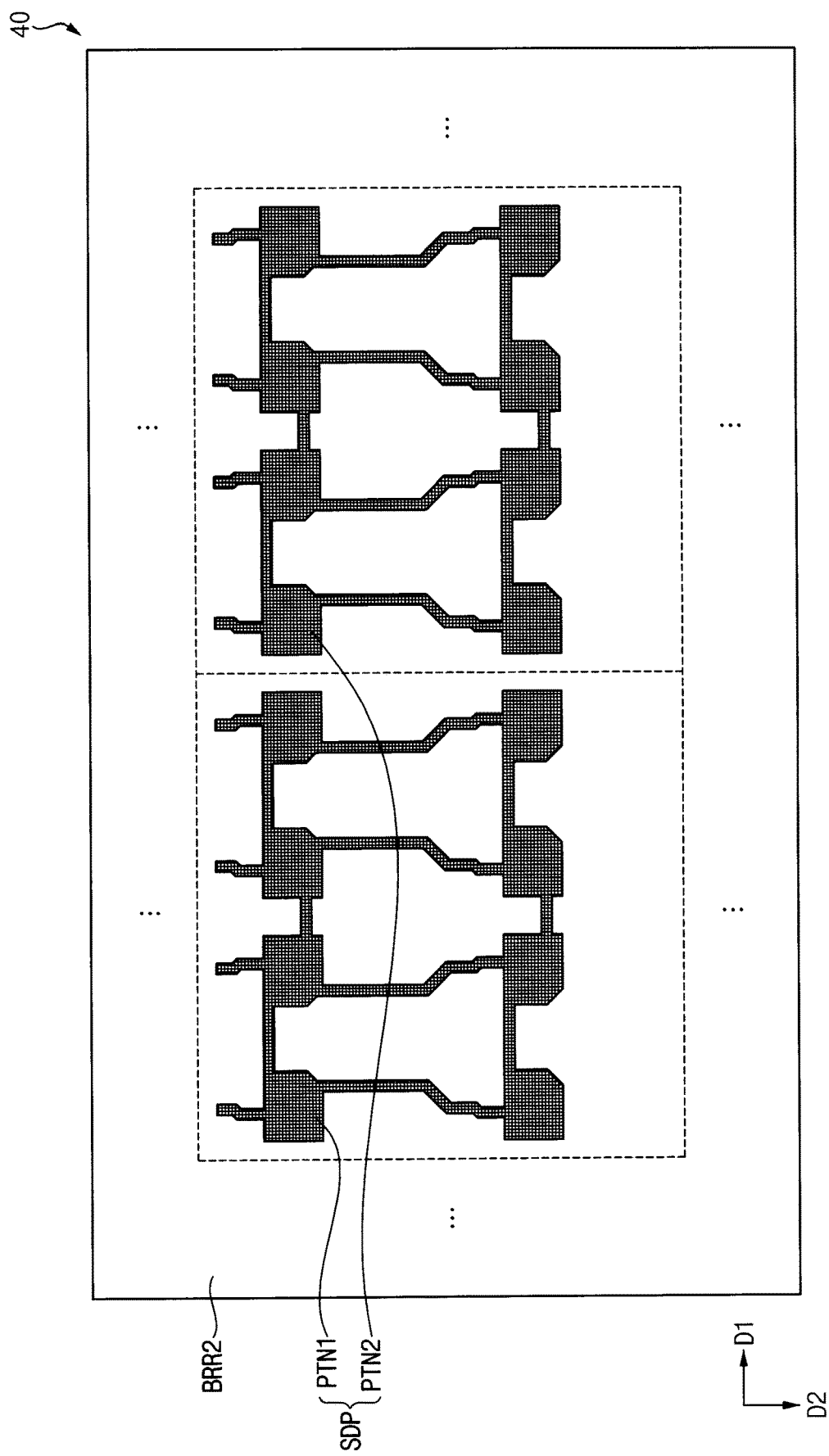
FIG. 31 and FIG. 32 are layout diagrams illustrating a display device according to still another embodiment.
Figure 32:
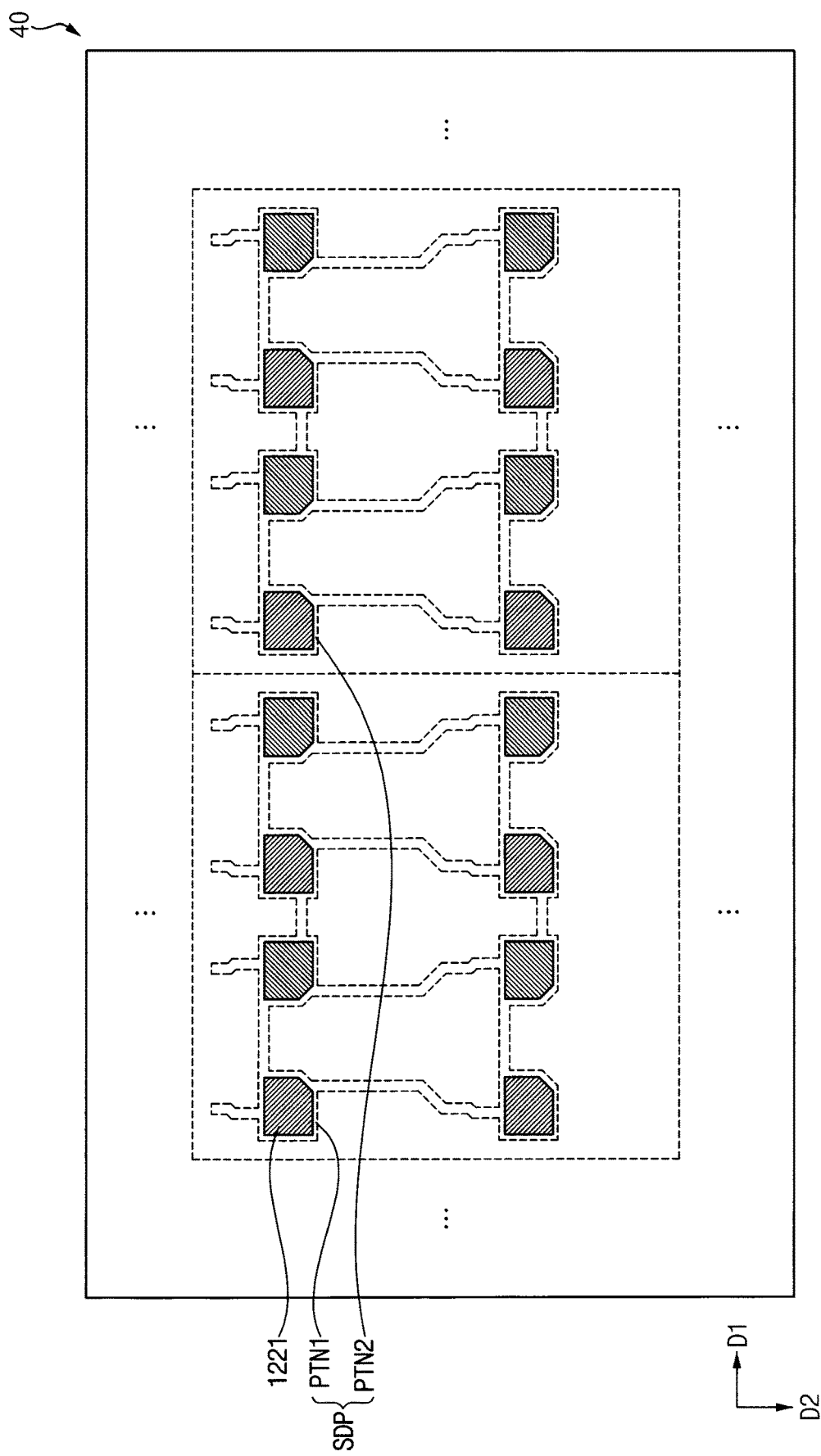

FIG. 31 and FIG. 32 are layout diagrams illustrating a display device according to still another embodiment.

Referring to FIGS. 31 and 32, the display device 40 according to still another embodiment may include a lower pattern SDP.

However, the display device 40 may be substantially the same as the display device 10 except for the shape of the lower pattern SDP. For example, the display device 40 may include the first organic film layer PI1, the first barrier layer BRR1, the second organic film layer PI2, the second barrier layer BRR2, the third barrier layer BRR3, the buffer layer BFR, the first active pattern 1100, the first gate insulating layer GI1, the first conductive pattern 1200, the second gate insulating layer GI2, the second conductive pattern 1300, the first interlayer insulating layer ILD1, the second active pattern 1400, the third gate insulating layer GI3, the third conductive pattern 1500, the second interlayer insulating layer ILD2, the fourth conductive pattern 1600, the first via insulating layer VIA1, the fifth conductive pattern 1700, and the second via insulating layer VIA2. Hereinafter, the shape of the lower pattern SDP will be mainly described.

The lower pattern SDP included in the display device 40 may be disposed on the second barrier layer BRR2. In some embodiments, the lower pattern SDP may have an island shape.

In some embodiments, the lower pattern SDP may include a first pattern PTN1 and a second pattern PTN2. The second pattern PTN2 may have the same shape as the first pattern PTN1, and may not be connected to the first pattern PTN1.

In some embodiments, the first pattern PTN1 may have a mesh shape. In addition, the gate electrodes 1221 may be arranged in a matrix shape. Accordingly, the first pattern PTN1 may overlap the plurality of gate electrodes 1221. For example, as shown in FIG. 32, the first pattern PTN1 may overlap the eight gate electrodes 1221. In other words, the first pattern PTN1 may correspond to the eight sub-pixels (i.e., two pixels). However, the number of the sub-pixels corresponding to the first pattern PTN1 is not limited thereto. For example, the first pattern PTN1 may correspond to four sub-pixels (i.e., one pixel). Alternatively, it may correspond to 12 sub-pixels (i.e., three pixels).

Figure 33:
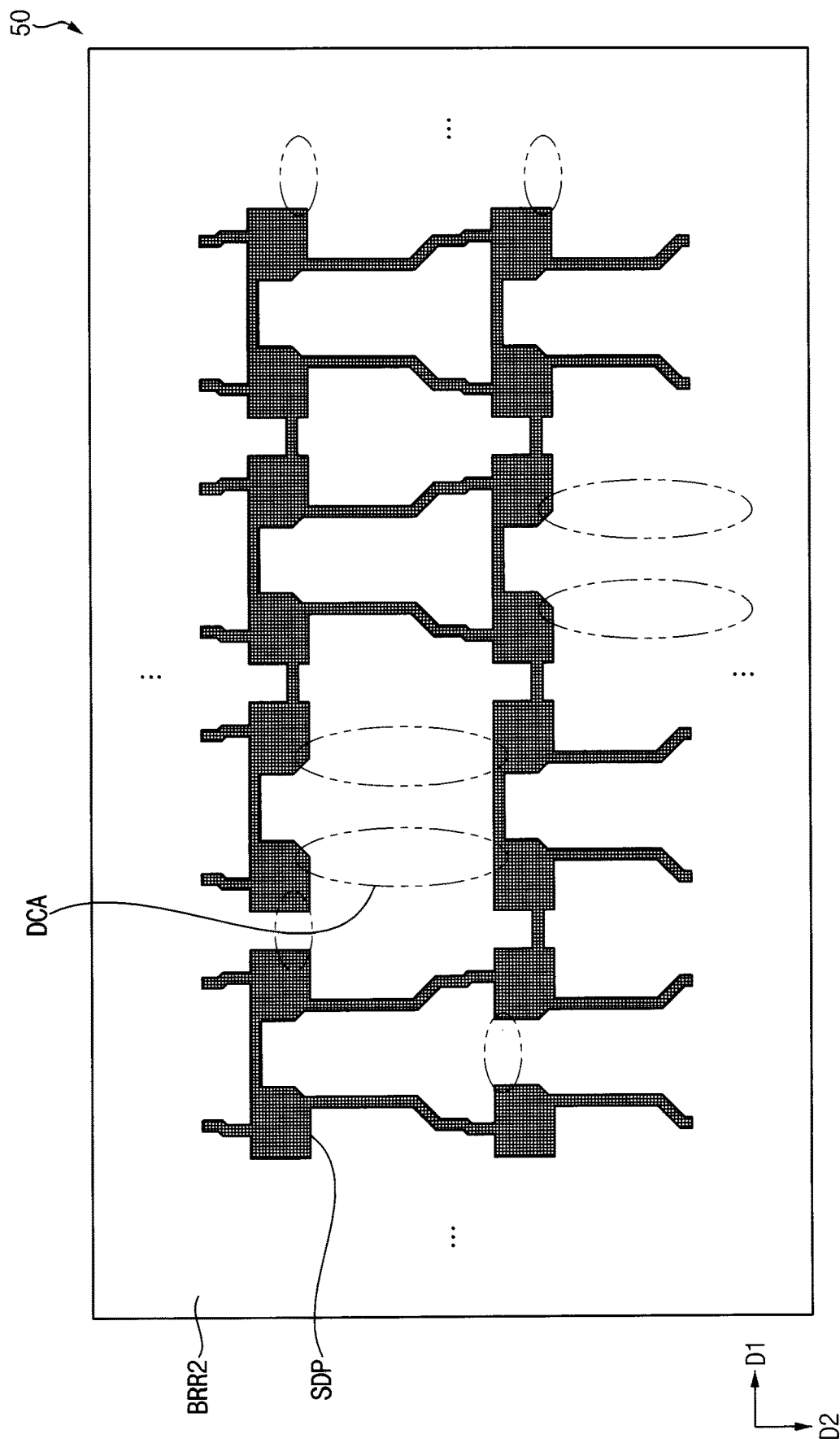
FIG. 33 and FIG. 34 are layout diagrams illustrating a display device according to still another embodiment.
Figure 34:
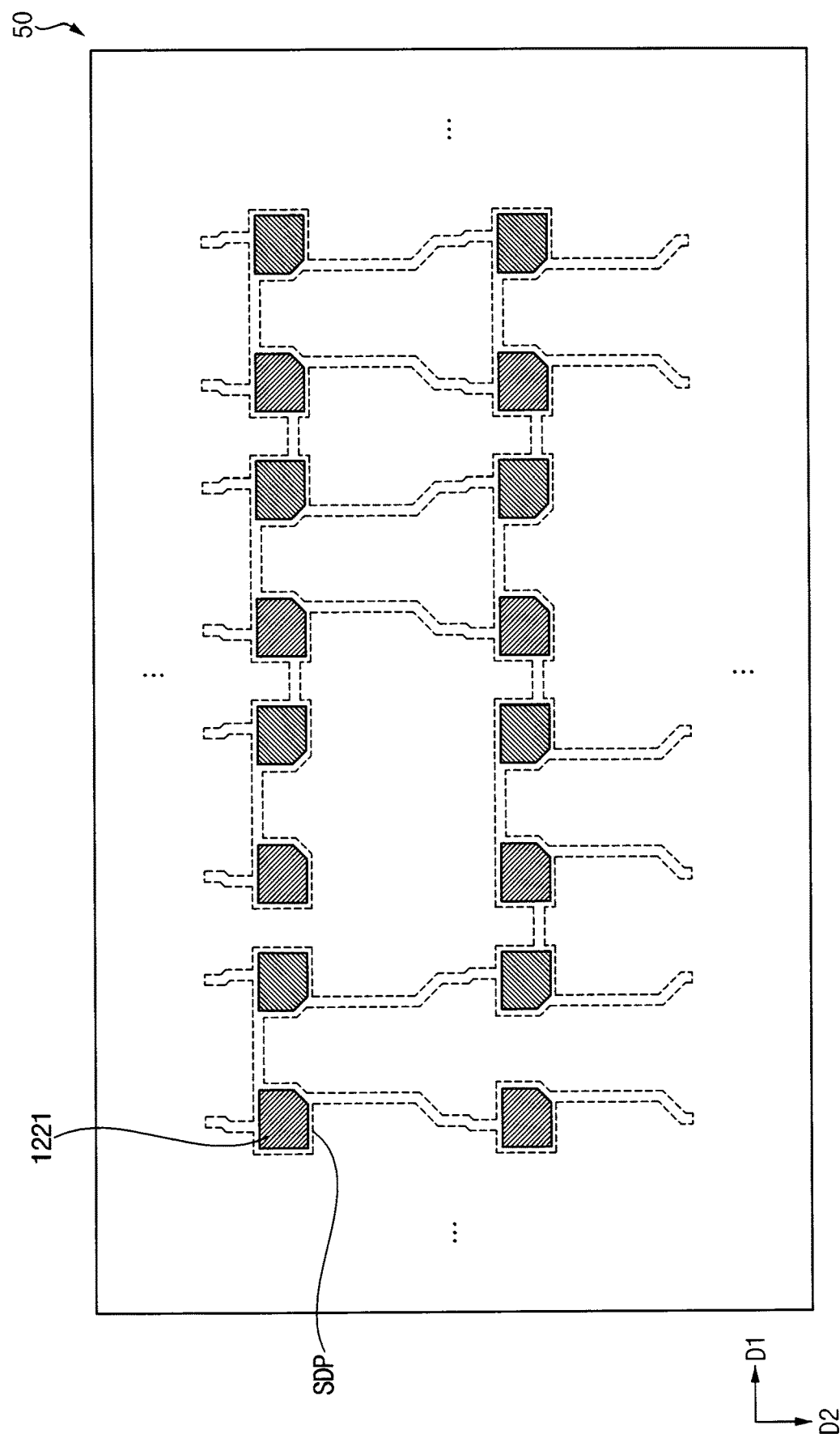

FIG. 33 and FIG. 34 are layout diagrams illustrating a display device according to still another embodiment.

Referring to FIGS. 33 and 34, the display device 50 according to still another embodiment may include a lower pattern SDP.

However, the display device 50 may be substantially the same as the display device 10 except for the shape of the lower pattern SDP. For example, the display device 50 may include the first organic film layer PI1, the first barrier layer BRR1, the second organic film layer PI2, the second barrier layer BRR2, the third barrier layer BRR3, the buffer layer BFR, the first active pattern 1100, the first gate insulating layer GI1, the first conductive pattern 1200, the second gate insulating layer GI2, the second conductive pattern 1300, the first interlayer insulating layer ILD1, the second active pattern 1400, the third gate insulating layer GI3, the third conductive pattern 1500, the second interlayer insulating layer ILD2, the fourth conductive pattern 1600, the first via insulating layer VIA1, the fifth conductive pattern 1700, and the second via insulating layer VIA2. Hereinafter, the shape of the lower pattern SDP will be mainly described.

The lower pattern SDP included in the display device 50 may be disposed on the second barrier layer BRR2. In some embodiments, the lower pattern SDP may have a mesh shape defining the disconnection area DCA, and may overlap the gate electrodes 1221 disposed in a matrix shape. In some embodiments, as shown in FIG. 33, the disconnection area DCA may be randomly located. Accordingly, the lower pattern SDP may be randomly disconnected. Accordingly, the unit area of the lower pattern SDP may be reduced.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display panel comprising:
    a substrate;
    a first barrier layer on the substrate;
    a lower pattern on the first barrier layer and having a mesh shape defining a disconnection area;
    a second barrier layer on the first barrier layer, covering the lower pattern, and contacting the first barrier layer in the disconnection area;
    a first active pattern on the second barrier layer and overlapping the lower pattern;
    at least one gate electrode on the first active pattern and overlapping the lower pattern;
    at least one first gate line on the first active pattern, extending in a first direction, and adjacent to a first side of the at least one gate electrode in a plan view;
    a second active pattern on the first gate line;
    at least one second gate line on the second active pattern, extending in the first direction, and adjacent to a second side of the at least one gate electrode in the plan view, wherein the second side is opposite the first side; and
    at least one data line on the second gate line and extending in a second direction crossing the first direction.

2. The display panel of claim 1, wherein the lower pattern comprises:
    a first pattern extending in the second direction; and
    a second pattern extending in the second direction and spaced apart from the first pattern along the first direction,
    wherein the disconnection area is between the first pattern and the second pattern, and
    wherein the first pattern and the second pattern are not connected to each other.

3. The display panel of claim 2, wherein the first pattern and the second pattern have the same shape.

4. The display panel of claim 2, wherein the at least one gate electrode comprises first to fourth gate electrodes arranged with each other along the first direction, and wherein the first pattern comprises:
- a first auxiliary pattern overlapping the first gate electrode;
- a second auxiliary pattern overlapping the second gate electrode;
- a third auxiliary pattern overlapping the third gate electrode; and
- a fourth auxiliary pattern overlapping the fourth gate electrode.

5. The display panel of claim 4, wherein the second auxiliary pattern is symmetrical in shape with the first auxiliary pattern in the first direction, and
the fourth auxiliary pattern is symmetrical in shape with the third auxiliary pattern in the first direction.

6. The display panel of claim 4, wherein the first to fourth auxiliary patterns are connected to each other.

7. The display panel of claim 4, further comprising:
at least one power voltage line in a same layer as the data line, extending in the second direction, and being to transmit a power voltage,
wherein the first auxiliary pattern overlaps the power voltage line.

8. The display panel of claim 2, wherein the second pattern is symmetrical in shape with the first pattern in the first direction.

9. The display panel of claim 8, wherein the at least one gate electrode comprises a first gate electrode and a second gate electrode which are arranged with each other along the first direction,
the first pattern overlaps the first gate electrode, and
the second pattern overlaps the second gate electrode.

10. The display panel of claim 8, further comprising:
at least one power voltage line in a same layer as the data line, extending in the second direction, and being to transmit a power voltage,
wherein the first pattern overlaps the power voltage line.

11. The display panel of claim 1, wherein the lower pattern comprises:
a first pattern extending in the first direction; and
a second pattern extending in the first direction and spaced from the first pattern in the second direction, and
wherein the disconnection area is between the first pattern and the second pattern, and
the first pattern and the second pattern are not connected to each other.

12. The display panel of claim 11, wherein the first pattern and the second pattern are the same in shape.

13. The display panel of claim 11, wherein the at least one gate electrode comprises first and second gate electrodes arranged with each other along the second direction,
the first pattern overlaps the first gate electrode, and
the second pattern overlaps the second gate electrode.

14. The display panel of claim 1, the second barrier layer is greater in thickness than the first barrier layer.

15. The display panel of claim 1, wherein the lower pattern comprises a same metal as the at least one gate electrode.

16. The display panel of claim 1, wherein the first active pattern comprises a silicon semiconductor, and
the second active pattern comprises an oxide semiconductor.

17. A display device comprising a display panel,
wherein the display panel comprises:
a substrate;
a first barrier layer on the substrate;
a lower pattern on the first barrier layer and having a mesh shape defining a disconnection area;
a second barrier layer on the first barrier layer, covering the lower pattern, and contacting the first barrier layer in the disconnection area;
a first active pattern on the second barrier layer and overlapping the lower pattern;
at least one gate electrode on the first active pattern and overlapping the lower pattern;
at least one first gate line on the first active pattern, extending in a first direction, and adjacent to a first side of the at least one gate electrode on a plane;
a second active pattern on the first gate line;
at least one second gate line on the second active pattern, extending in the first direction, and adjacent to a second side of the at least one gate electrode on a plane, wherein the second side is opposite the first side; and
at least one data line on the second gate line and extending in a second direction crossing the first direction.

18. The display device of claim 17, further comprising:
an optical sensor module under the display panel and overlapping a fingerprint recognition area; and
an air layer between the display panel and the optical sensor module and overlapping the fingerprint recognition area,
wherein the lower pattern overlaps the fingerprint recognition area.

* * * * *